US010955511B2

United States Patent
Rehwald et al.

(10) Patent No.: US 10,955,511 B2
(45) Date of Patent: Mar. 23, 2021

(54) MAGNETIC RESONANCE IMAGING COIL NORMALIZATION BY USING A REFERENCE IMAGE

(71) Applicants: Siemens Healthcare GmbH, Erlangen (DE); Duke University, Durham, NC (US)

(72) Inventors: Wolfgang G. Rehwald, Chapel Hill, NC (US); David C. Wendell, Durham, NC (US); Elizabeth R. Jenista, Durham, NC (US); Enn-Ling Chen, Chapel Hill, NC (US); Raymond J. Kim, Chapel Hill, NC (US)

(73) Assignees: Siemens Healthcare GmbH, Erlangen (DE); Duke University, Durham, NC (US)

(*) Notice: Subject to any disclaimer, the term of this patent is extended or adjusted under 35 U.S.C. 154(b) by 0 days.

(21) Appl. No.: 16/438,585

(22) Filed: Jun. 12, 2019

(65) Prior Publication Data
US 2020/0241100 A1    Jul. 30, 2020

Related U.S. Application Data

(60) Provisional application No. 62/796,761, filed on Jan. 25, 2019.

(51) Int. Cl.
*G01R 33/565* (2006.01)
*G01R 33/56* (2006.01)
*G06T 11/00* (2006.01)

(52) U.S. Cl.
CPC ... *G01R 33/56545* (2013.01); *G01R 33/5602* (2013.01); *G01R 33/5608* (2013.01); *G06T 11/005* (2013.01); *G06T 2211/424* (2013.01)

(58) Field of Classification Search
CPC .......... G01R 33/56545; G01R 33/5608; G01R 33/5602; G06T 11/005; G06T 2211/424
See application file for complete search history.

(56) References Cited

U.S. PATENT DOCUMENTS

2019/0076049 A1 *   3/2019   Satoh ..................... G01R 33/56

OTHER PUBLICATIONS

P. Kellman et al., "Phase-Sensitive Inversion Recovery for Detecting Myocardial Infarction Using Gadolinium-Delayed Hyperenhancement," Magnetic Resonance in Medicine, 47(2), pp. 372-383, 2002.

(Continued)

*Primary Examiner* — Susan S Lee

(57) ABSTRACT

A method for correcting image inhomogeneity includes acquiring a non-normalized image and a reference image using receiver coils. A high-signal mask and a low-signal mask are created. Each pixel in the high-signal mask is set to a predetermined integer value if the reference image pixel at the same specific location has a value above a threshold value. Each pixel in the low-signal mask is set to the predetermined integer value if the reference image pixel at the same specific location has a value below or equal to the threshold value. A coil normalization map is created by smoothing the reference image with filters. Then, an iterative procedure is performed to update the coil normalization map using the high-signal mask and the low-signal mask. Following the iterative procedure, the non-normalized image is divided by the current coil normalization map to yield a normalized image.

20 Claims, 17 Drawing Sheets

(56) References Cited

OTHER PUBLICATIONS

Axel, L., J. Costantini, and J. Listerud, "Intensity correction in surface-coil MR imaging", American Journal of Roentgenology, 1987. 148(2): p. 418-420.
Belaroussi, Boubakeur, et al. "Intensity non-uniformity correction in MRI: existing methods and their validation." Medical image analysis 10.2 (2006): 234-246.
Brey, William W., and Ponnada A. Narayana. "Correction for intensity falloff in surface coil magnetic resonance imaging." Medical Physics 15.2 (1988): 241-245.
Murakami, James W., Cecil E. Hayes, and E. D. Weinberger. "Intensity correction of phased-array surface coil images." Magnetic Resonance in Medicine 35.4 (1996): 585-590.

* cited by examiner

MAGNETIC RESONANCE IMAGING COIL NORMALIZATION BY USING A REFERENCE IMAGE

CROSS-REFERENCE TO RELATED APPLICATIONS

This application claims the benefit of U.S. Provisional Application Ser. No. 62/796,761 filed Jan. 25, 2019, which is incorporated herein by reference in its entirety.

TECHNICAL FIELD

The present invention relates generally to methods, systems, and apparatuses for using a reference image for coil normalization in Magnetic Resonance Imaging (MRI) applications. The disclosed methods, systems, and apparatuses are especially advantageous in the context of phase sensitive inversion recovery (PSIR) imaging, but can generally be combined with any imaging sequence and work in any body part.

BACKGROUND

Magnetic Resonance Imaging (MRI) scanners acquire images with radiofrequency receiver coils placed on the imaged patient. These coils are also known as "surface coils" or "coil arrays," because they are placed on the imaged object's surface or on top of the patient and consist of multiple small coils assembled into a larger array. Their ability to sense a magnetic signal, more commonly known as "coil sensitivity," decreases drastically with the distance of the signal origin from the coil. Therefore, the further the distance between coil and imaged slice, the smaller becomes the signal and the darker the acquired image. Additionally, images acquired perpendicular to the coil exhibit a strong sensitivity gradient across their field of view. Therefore, depending on its orientation, the image can have a very variable image intensity that is not due to the imaged true anatomy or designed image contrast, but merely an expression of the coil sensitivity. To create an image wherein pixel intensity is only an expression of true anatomy, pathology, and intended contrast such as T1- or T2-contrast, a pixel-by-pixel image intensity normalization known as "coil normalization" is needed. Ideally such normalization will restore the signal intensity of a homogeneous test "phantom" (e.g., a water bottle) so that each pixel in the phantom has the same image intensity regardless of its distance from the coil.

Multiple methods for coil normalization exist. They can be classified by two properties: the type of images and the type of receiver coils they require. Some techniques only require a single image, the original, non-normalized image that is referred to herein as the "use-image". A typical example for a use-image is a T1-, T2- or proton density-weighted image. Other techniques additionally need a reference image without significant T1- or T2-contrast also known as a non-weighted image. Note that the terms "weighting" and "image contrast" shall be used synonymously in this disclosure. Most techniques acquire reference images only with surface coils (also known as phased array coils), but some use both surface coils and the large volume coil built into the scanner (also known as body coil). Any combinations of methods from both classifications are possible resulting in the four commonly used methods: the two-coil method, the use-image-derived method, the separate reference image method, and the Biot-Savart law method.

The two-coil method (with the vendor name "Prescan Normalize" from Siemens Healthineers) acquires a stack of reference images of typically low spatial resolution with 3D MRI. The images are non-weighted, for example, using low flip angle gradient echo imaging. Each raw data line is acquired with the surface coil as well as the built-in volume coil in interleaved fashion. It is assumed that the volume coil possesses homogeneous sensitivity, whereas the sensitivity of the surface coil is highly spatially varying and falling off nonlinearly with the distance from the coil. Dividing the surface coil reference image by the volume coil reference image yields the surface coil's sensitivity map. To obtain a coil-normalized use-image, the acquired use-image is divided by the calculated surface coil's sensitivity map.

A deficiency of the two-coil method is that a separate scan is needed prior to acquiring the use-image. This requires some time which is not a problem if done once before multiple use-scans. But it would be too time-consuming if done prior to every use-scan. Therefore the pre-scan is not repeated for every image acquisition. Rather, it is acquired as a 3D volume once prior to the very first use-image acquisition. When acquiring a use-image in a specific slice orientation later, the use-image is normalized by calculating the normalization map for that slice using the pre-scan data acquired earlier. This scheme can be problematic, because the patient may have moved between the pre-scan and image scan. It is normal that patients slightly shift during the exam due to pain, itching or other medical condition. More importantly, the flexible surface coils may also move between the time points of reference and use image acquisition, because the surface coils are not tightly affixed to the patient for reasons of patient comfort and avoiding claustrophobia. Therefore, the acquired slice and the calculated sensitivity profile may be lacking sufficient spatial registration resulting in suboptimal coil normalization.

The use-image-derived method is a more common normalization method requiring neither a volume coil image nor a separate reference image which derives an estimated reference image by applying a very strong low-pass filter in the raw-data space or an averaging kernel in the image space to create a smoothed version of the acquired use-image. In theory, all image contrast due to T1, T2 or proton density-weighting is removed by the smoothing operation and only the coil sensitivity information remains. Dividing the acquired use-image by the estimated reference then creates a coil-normalized use-image.

The use-image-derived method works best in body regions with continuous areas of tissue or fluid and without air-filled cavities, for example, in a coronal slice of the brain. The smoothing or averaging for estimating the sensitivity map from the acquired use-image is capable of removing the original image contrast of the use-image so that only coil sensitivity information remains, provided that the smoothing is sufficiently strong (the averaged area is sufficiently large). However, at air-tissue interfaces, where low- and high-signal regions meet, for example, in tissue next to air-filled cavities such as the pulmonary space and the frontal sinus, the use-image-derived method has substantial limitations. The estimated sensitivity map, which is the heavily smoothed use-image, has low signal values not just in the low-signal region but also close to it. Dividing by this map creates an overly and unnaturally bright edge (edge enhancement artifact) in high-signal regions that are next to low-signal regions, for example, in the cardiac free wall next to the lungs. Stated differently, the transition between high- and low-signal regions is steep in the original use-image, but gradual in the smoothed image. This over-corrects the pixel values around this edge making them unnaturally bright on the low signal side of the normalized image. Also, image contrast is sometimes altered by this technique, especially if the applied smoothing is not strong enough for reducing edge enhancement artifacts. Specifics depend on the size of the averaging kernel (size of the averaged area equals the smoothing strength) relative to the observed anatomy.

Rather than estimating the coil sensitivity as in the previous method, the separate reference image method acquires a separate non-weighted reference image using the same coil (or coil assemblies) as for the use-image, usually surface coils, although a volume coil can be used as well. Weighting of the reference image is minimized by skipping any magnetization preparation such as an inversion recovery (IR) pulse prior to acquiring reference data, and by applying a very low readout flip angle for the reference data readout.

A typical application of the separate reference image method is the coil normalization of the phase sensitive inversion recovery (PSIR) sequence by Kellman, P., et al., *Phase-sensitive inversion recovery for detecting myocardial infarction using gadolinium-delayed hyperenhancement*. Magn Reson Med, 2002. 47(2): p. 372-83 as show in FIG. 1. In PSIR the acquisition of the use-image data with leading IR (item 100) pulse (hence called IR-DA, see 101-a) occurs in one heartbeat and the acquisition of the reference data (REF-DA, see 113-a) without IR pulse and with low flip angle readout in another heartbeat. Data is typically acquired in small portions known as segments and acquisitions of use-image and reference image are interleaved by heartbeat and take multiple heartbeats to complete during which the patient holds his breath. FIG. 1 shows segment 1 of IR-DA (101-a) acquired in first heartbeat, segment 1 of REF-DA (113-a) in the second heartbeat, segment 2 of IR-DA (101-b) in the third heartbeat, segment 2 of REF-DA (113-b) in the fourth heartbeat, and segment 3 of IR-DA (101-c) in the fifth heartbeat. Note that the heartbeats with IR-DA have a leading IR pulse (100) to impart T1-contrast, whereas those with REF-DA have not. The assumption is that magnetization is fully recovered at the time REF-DA is acquired so that the reference has no weighting. This assumption is not exactly true and some T1-weighting remains in the reference image. The reference image is processed by smoothing with a median filter of about 10 mm×10 mm size to remove any remaining image contrast (typically T1-contrast) that is naturally unrelated to coil sensitivity. Dividing the use image by this smoothed reference image results in a normalized use-image, specifically a PSIR image. FIG. 1 shows a flow-independent dark blood delayed enhancement (FIDDLE) image as example of a PSIR image. Note the bright infarct due to its shortened T1 and the dark-grey normal (healthy) myocardium.

A related method described in Axel, L., J. Costantini, and J. Listerud, *Intensity correction in surface-coil MR imaging*. American Journal of Roentgenology, 1987. 148(2): p. 418-420 acquires the reference image separately from (prior to) the use image. The reference is recorded in a homogeneous phantom which is free of texture or morphology, for example, a phantom filled with gel or saline doped with a T1-shortening contrast agent, so that smoothing for removal of remaining image contrast is unnecessary. Division of the use-image by the reference image yields the coil-normalized use-image.

Acquiring a reference image at about the same time, interleaved on a per heartbeat basis, with the use-image is generally advantageous. Foremost, the spatial registration of both data sets is usually excellent, unless major breathing motion occurs during the acquisition. Nonetheless there exist many problems with this approach. For example, the existing PSIR method applies only a small smoothing kernel of 7×7 pixels to a 1.4 mm spatial resolution image making it only 9.8 mm×9.8 mm in size. Smoothing is achieved by a median filter with the intent of preserving edges better than a mean (averaging) filter. The small filter size does not provide adequate smoothing needed to accurately represent the naturally slow varying coil sensitivity. A separate problem is that the reference image usually has a low signal-to-noise ratio (SNR) so that even a naturally edge-preserving median filter can cause artefactual edge enhancement at air-tissue interfaces exactly at the interface due to stronger noise contribution on the low signal side.

Interestingly, the relatively small filter size chosen to prevent said edge-enhancement artifacts creates a more serious problem. It can reduce image contrast and thereby render, for example, infarcted areas (short T1) less conspicuous relative to normal areas (longer T1) than in the original non-normalized magnitude image. In other words it can alter the image contrast in an unfavorable way and may disguise certain clinically relevant infarcts. The method requires that the reference image has no T1- or T2-weighting, which in practice often does not hold. This weighting combined with the lack of smoothing are the underlying reason for creating reduced infarct-to-normal myocardium contrast. For example, in the PSIR sequence the T1 values are too long to fully relax within one heartbeat, which is the typical time used in the PSIR pulse sequence between IR-DA (101) and REF-DA (113), as shown in FIG. 2. One can clearly see that tissue with different T1 has different magnetization values at the time of recording the reference data with REF-DA (113). The amount of T1-weighting depends on the patient's heart-rate (inverse of the RR-interval, see FIG. 1) and the trigger pulse, leading to a time delay TD (125 in FIG. 2). TD equals approximately the RR-interval (duration of one heartbeat) times the trigger pulse minus one. In practice, a trigger pulse of two is usually chosen as higher trigger pulses would extend the scan duration beyond most patients' breath-holding capability. For a given trigger pulse, a higher heart rate and consequentially a shorter TD increases T1-weighting of the reference. Also, the readout of the reference data itself imparts T1-weighting on the reference image. The combination of T1-weighting of the reference image together with a too small filter size can significantly corrupt T1-contrast of the normalized image. Specifically, using the conventional method, an infarct with an area of more than 25 pixels (more than half of the median-filter's area) would be reduced in intensity as the higher intensity of the reference image at this location would persist despite smoothing by a 7×7 median-filtering (49 pixels).

FIG. 3 illustrates the corruption of T1-contrast in the PSIR image obtained by the conventional coil normalization of PSIR. In the experiment underlying FIG. 3 the REF-DA was executed with time delay TD (125 in FIG. 2) after acquiring the use-image data (IR-DA). TD was varied from 120 ms to 1420 ms in 100 ms increments, first going left to right, then top to bottom, with the purpose of imparting different T1-contrast on the reference image as function of TD. The upper test tube A had a long T1 of about 865 ms, the lower tube B a short T1 of about 230 ms. Effective TR was kept constant at 2000 ms corresponding to a typical RR of 1000 ms and a trigger pulse of 2. As can be seen in the non-normalized magnitude images in the upper panel (301), the contrast between the test tubes with long and the short T1 does not change with TD. In the reference images in panel 303 however, the significant change in contrast between both test tubes can be observed as a function of TD, see black horizontal arrows, and is intended in this experiment. A strong T1 contrast is present for a short TD (TD=120 ms), because the magnetization in the long-T1 test tube did not have time to recover. The longer TD becomes, the more relaxation occurs. For 820 ms≤TD≤1420 ms no further change in contrast between reference images with different TD is observed. Using such reference image in the conventional coil normalization of PSIR results in PSIR images that have a strong dependence on the T1-weighting of the respective reference image. In panel 305 it can be appreciated that the upper test tube with long T1 changes intensity significantly in the images from TD 120 ms to TD 820 ms. The short T1 test tube also changes intensity for the first three TDs but then, the first order, remains constant. The change in contrast becomes evident when comparing the images at TD 120 ms and TD 1420 ms, see white horizontal errors. Therefore, the contrast between both test tubes in the normalized image changes a s a function of T1-weighting of the reference image. This is problematic, if clinical diagnosis is based on signal differences that may already be small in the original non-normalized use-image. Differences may become undiscernible in the normalized PSIR image and infarcts may be missed. In the specific example of panel 305, test tube A has negative signal due its long T1 and the short inversion time (TI) used. When dividing by the T1-weighted reference image at TD 120 ms, in the normalized image this test tube is depicted more negative (darker) than it actually is. Whereas this exaggerated contrast between test tubes A (long T1) and B (short T1) may superficially appear beneficial, it is actually problematic, because a fake contrast is created that may pretend a non-existent pathology.

Two other problems of the separate-reference-image method exist. First, for regions of low signal, such as air surrounding the patient and the pulmonary space, appear overly bright in the coil-normalized image. This is the result of dividing by naturally small signal values in the air rendering pixels that are black in the non-normalized image grey in the normalized image. Second, regions that have low signal in the reference image appear overly noisy in the coil-normalized image, they look speckled and like salt-and-pepper, which is why this appearance is also called "salt-and-pepper noise". This is due to the fact that noise has a larger relative contribution to overall signal in low-signal regions (air, the lungs) than in tissue, and dividing by these air pixels of the reference image results in noise amplification.

Image 405 in FIG. 4 shows a phantom example illustrating both artifacts, as well as the corresponding use-image 401 and reference image 403. Note the speckled and high-signal appearance of the air in image 405. The noise is usually much more conspicuous than in the use-image-derived method (not shown), because the sensitivity map is noisier due to the use of a median-filter and its small size.

Related to the above problem is the amplification of Gibbs ringing. At borders of stark intensity differences minor Gibbs ringing is observable in the original non-normalized use-image (401 in FIG. 4). This can only be appreciated when adjusting image contrast and brightness in an extreme manner (not shown in FIG. 4). In practice, this artifact is thus invisible in the non-normalized image. In the PSIR-normalized image however, the artifact is amplified on the low side of the border between high and low signal and becomes clearly visible, see arrows at image 405. This is a manifestation of above problems. Also, any other artifact in the low signal region, even if faint and hardly visible in the non-normalized use-image, is amplified and clearly visible in the image normalized by the separate-reference-image method Yet another, but uncommon and impractical coil normalization technique calculates the coil sensitivity from the Biot-Savart law using knowledge of the coil's size, shape, and position relative to the patient. The calculations are quite complex and, in addition, the method is hampered by the problem that the exact coil location and loading varies by patient so that the calculated sensitivity map does not accurately reflect true sensitivity in any given patient. This method has therefore no clinical significance.

In summary, conventional coil normalization techniques each have one or more of the following issues: image contrast can be reduced impacting clinical diagnosis, low signal regions show amplified, unsightly noise and appear overly bright in the normalized use-image, and even the slightest artifacts in the use-image are strongly amplified in low signal regions. Accordingly, it is desired to provide a coil normalization technique that addresses these issues and can be readily implemented on MRI systems.

SUMMARY

Embodiments of the present invention address and overcome one or more of the above shortcomings and drawbacks, by providing methods, systems, and apparatuses for coil normalization using a reference image. Briefly, the techniques described herein separate the reference image into a low- and a high-signal region and represents them as pixel masks. It also applies a very strong smoothing function to the reference image and masked combinations of reference and normalization maps of previous iteration steps. It combines the masking and the smoothing functionality in an iterative manner until a normalization map without T1-contrast and without abrupt changes due to morphology is obtained. This substantially restores the optimal infarct-to-myocardium contrast and prevents the artifacts produced by the conventional PSIR coil normalization. The created normalization map is much smoother and less noisy than that of the conventional PSIR normalization, and any abrupt signal changes present in the reference image are not propagated to the map. The normalized image obtained with the disclosed technique typically shows a better infarct-to-normal T1-contrast and overall fewer artifacts.

According to some embodiments, a computer-implemented method for correcting image inhomogeneity caused by inhomogeneous sensitivity of receiver coils using during an MRI acquisition includes acquiring a non-normalized image and a reference image using one or more receiver coils. In one embodiment, the non-normalized image is a real part image obtained from a phase-sensitive reconstruction. A high-signal mask and a low-signal mask of the reference image are created. Each pixel in the high-signal mask at its specific location is set to a predetermined integer value if the reference image pixel at the same specific location has a value above a threshold value. Each pixel in the low-signal mask at its specific location is set to the predetermined integer value if the reference image pixel at the same specific location has a value below or equal to the threshold value. A current coil normalization map is created by smoothing the reference image with one or more filters. An iterative procedure is performed until occurrence of a stopping condition. This iterative procedure includes creating a new coil normalization map comprising (i) portions of the current coil normalization map corresponding to pixels marked with the predetermined integer value in the low-signal mask, and (ii) portions of the reference image corresponding to pixels marked with the predetermined integer value in the high-signal mask. The new coil normalization map is smoothed using the filters, and the current coil normalization map with the new coil normalization map for the next iteration. Following the iterative procedure, the non-normalized image is divided by the current coil normalization map to yield a normalized image.

Various enhancements, refinements, and other modifications may be applied to the aforementioned method in different embodiments. For example, the stopping condition for the iterative procedure may be reaching a maximum number of iterations or determining that a sum of absolute values of a pixel difference map between an old and a new coil normalization map is below a predefined limit. In some embodiments, the threshold value used in creating the mask is the mean of noise in the reference image plus the standard deviation of the noise in the reference image. The mean and the standard deviation may be derived, for example, from a histogram of the reference image. The filters used for smoothing in the aforementioned method may include a mean-filter smoothing in image space. For example, in one embodiment, the mean-filter is at least 20 mm large in any given dimension. In other embodiments, the filters comprise a median-filter smoothing in image space. In other embodiments, the filters comprise a low pass filter smoothing in raw data space.

According to other embodiments, an article of manufacture for correcting image inhomogeneity caused by inhomogeneous sensitivity of receiver coils using during an MRI acquisition comprises a non-transitory, tangible computer-readable medium holding computer-executable instructions for performing the aforementioned method. The instructions may also perform any of the various modifications described above.

According to another aspect of the present invention, a system for correcting image inhomogeneity caused by inhomogeneous sensitivity of receiver coils using during MRI acquisition includes a magnetic field generator and one or more computers. The magnetic field generator includes one or more coils configured to acquire a non-normalized image and a reference image. The computers are connected to the magnetic field generator and perform a method similar to the one discussed above. More specifically, the computers acquire a reference image with the receiver coils. The computers create a high-signal mask and a low-signal mask based on that reference image, as well as an initial current coil normalization map. The computers then perform an iterative procedure until occurrence of a stopping condition. During each iteration of the iterative procedure a new coil normalization map is created that includes (i) portions of the current coil normalization map corresponding to pixels included in the low-signal mask, and (ii) portions of the reference image corresponding to pixels included in the high-signal mask. The resulting new coil normalization map is smoothed using the filters for use in the next iteration. Following the iterative procedure, the computers divide the non-normalized image by the current coil normalization map to yield a normalized image.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

Figure 1:
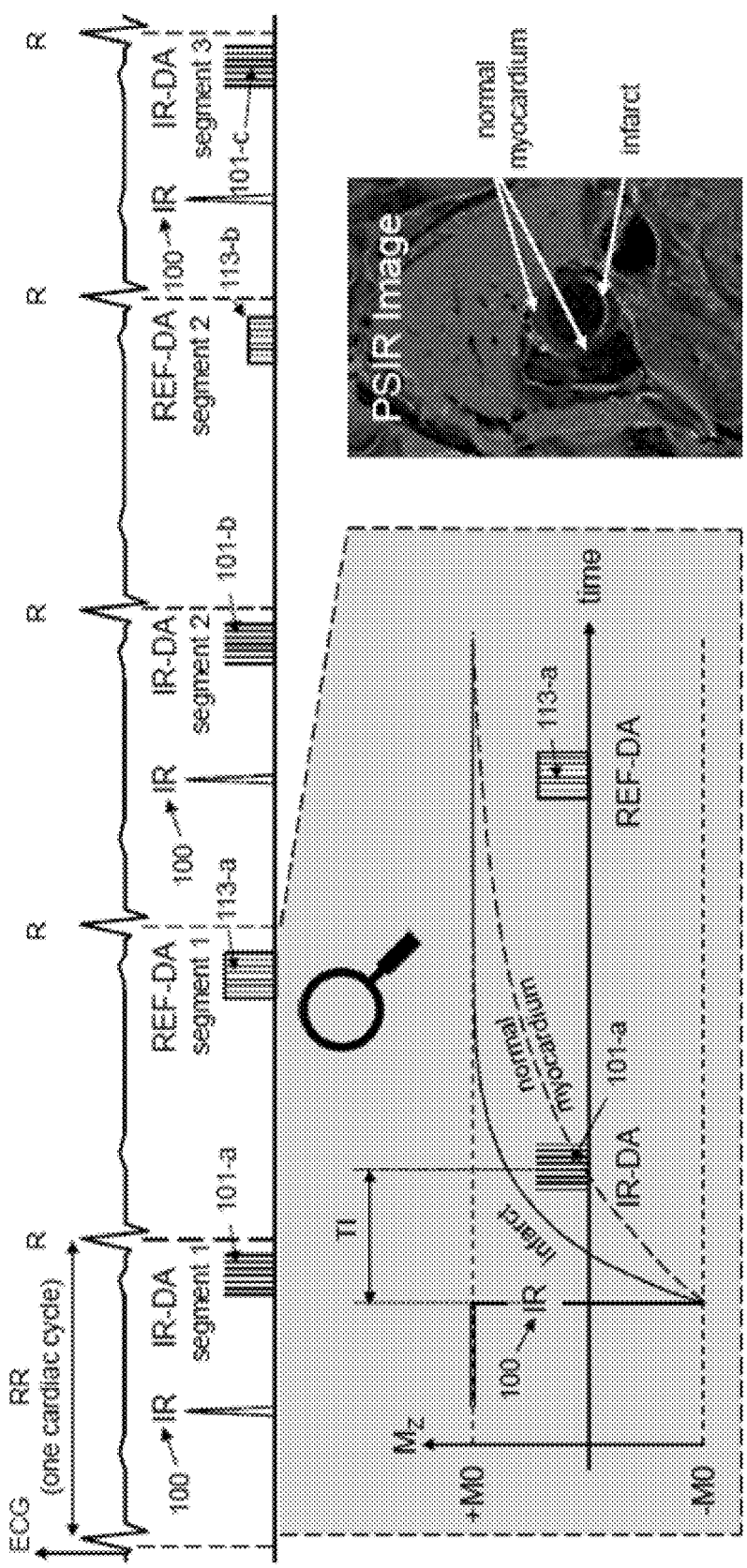
FIG. 1 illustrates a conventional technique for performing coil normalization of a phase sensitive inversion recovery (PSIR) sequence.
Figure 2:
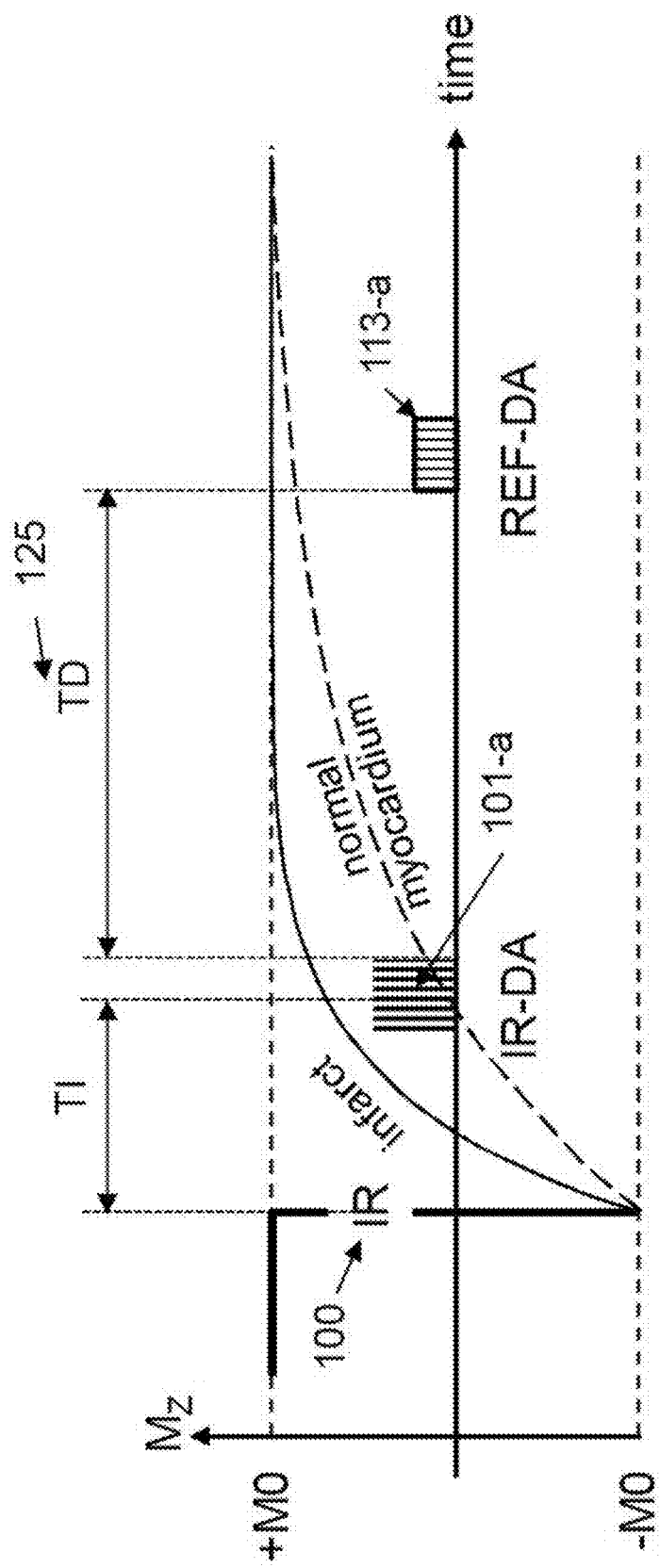
FIG. 2 is an illustration of T1 relaxation curves as they are observed during a typical PSIR sequence.

The present invention relates generally to methods, systems, and apparatuses for MRI coil normalization using a reference image. Briefly, the techniques described herein calculate a coil-normalized MR image by evaluating two acquired images: an image with morphologic, physiologic or other information, referred to herein as "the use-image" and containing diagnostic information including in the form of T1, T2 or other weighting, and a reference image with less weighting. One advantage of the techniques described herein over conventional techniques is the preservation of the image contrast of the original non-normalized use-image in the normalized image, without introducing artefactual image contrast and artifacts by the coil normalization process. The techniques described herein are preferably applied to data obtained with the PSIR sequence; however these techniques can be used for any pair of use-image and reference image obtained at the same slice location.

The techniques described herein address the limitations of conventional coil normalization techniques by recognizing two aspects of coil normalization not readily apparent and previously ignored by those skilled the art, and uses these new insights to improve upon existing methods. Specifically the disclosed techniques belong to the group of separate-reference-image methods and improves upon the image reconstruction algorithm of the existing, conventional PSIR method.

In the conventional PSIR method, there is an implicit assumption that a reference image has no weighting. This assumption often does not hold. For example, reference images obtained with the PSIR sequence always have some degree of T1-weighting, because there's insufficient time before the reference image readout for full magnetization recovery. This modifies the T1-contrast in the normalized use-image, since it is created by dividing the non-normalized use-image having strong T1-contrast by the reference image with weak but non-negligible T1-contrast. Regions with short T1 and thus bright appearance in both non-normalized use-image and reference image will have reduced intensity in the normalized image. Analogously, regions with long T1 that are darker in the reference image will have amplified signal in the normalized image. Interestingly, amplified signal can translate into brighter or darker pixel intensity depending on the sign of the long T1 region. A negative region will appear too dark in the normalized image, a positive region too bright. Therefore it is important to remove any T1-weighting in the reference image prior to dividing by it. This can be done by applying a very strong smoothing filter. It is also well known that coil sensitivity varies slowly and continuously across space anyway, and that therefore a strong smoothing filter is advantageous for removing any visible morphology in the reference image. In fact, a sensitivity map that closely follows morphology and/or weighting of the reference image due to a lack of smoothing does not truly represent coil sensitivity. However, the conventional techniques do not use an adequately strong smoothing filter with the rationale that a too strong smoothing causes unwanted edge enhancement artifacts at borders between low and high signal such as air-tissue interfaces.

The techniques described herein address this conflict between avoidance of reduced T1-contrast and artefactual edge enhancement by combining a strong smoothing filter with a low-high signal mask and an iterative procedure of filling low-signal regions. Thereby true coil sensitivity can be obtained to maintain true T1-contrast while simultaneously preventing edge enhancement artifacts.

The problems of noise amplification and overly bright depiction of low-signal regions described in the previous sections are addressed by the techniques disclosed herein. In the conventional PSIR coil normalization, a small 7×7 pixels median filter provides insufficient smoothing particularly in low-signal regions. As a consequence, salt-and-pepper noise is present in all low-signal regions of PSIR-normalized images. The disclosed techniques employ much stronger smoothing and filling of low-signal regions with true sensitivity information and thereby prevent division by small noisy numbers that are the cause of the salt-and-pepper noise. Furthermore, a coil-sensitivity below a given threshold (e.g., 2% of the maximum sensitivity) is physically impossible in patient imaging with known maximum distances of imaged tissue from the coils. Such low sensitivity is rather an artifact of the imperfect measurement in low-signal regions, for example, the pulmonary space or air surrounding the patient. Therefore the techniques disclosed herein can limit the range of sensitivity map values between an upper bound of 100% and a lower bound of typically 2%. Combining all described improvements, the unsightly salt-and-pepper noise and the overly bright depiction of low-signal regions is largely eliminated.

Figure 5:
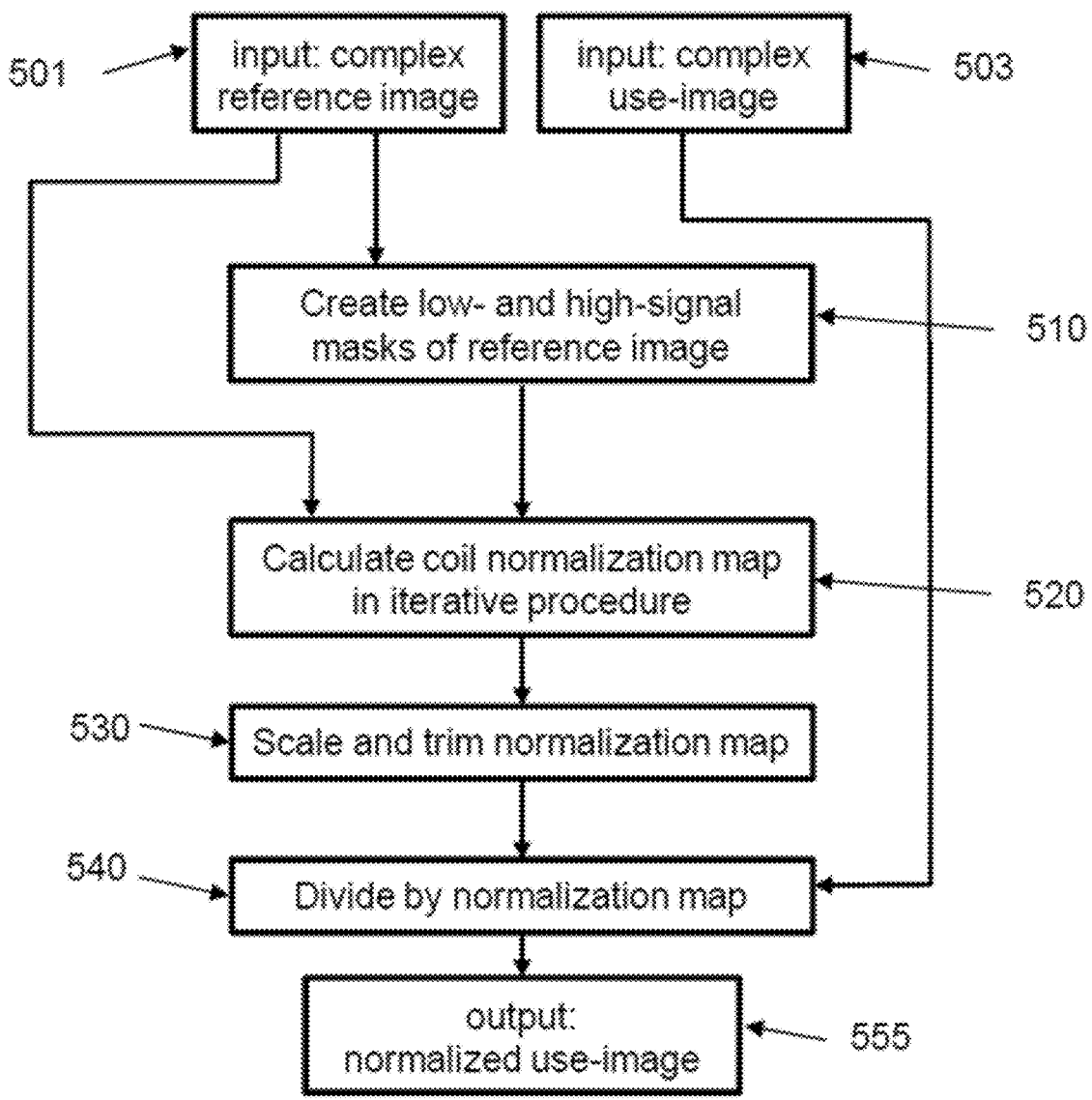
FIG. 5 provides a flowchart illustrating the improved coil normalization technique described herein, according to some embodiments.

FIG. 5 provides a flow chart detailing one example of performing coil normalization, according to some embodiments. A complex reference image (501) and a complex use-image (503) are required as inputs. When using the improved normalization technique as part of PSIR reconstruction, the use-image is an inversion recovery image. Other types of use-images such as a T2-prepared image can be used. Note that the input image has complex pixel values; a complex value or number possesses amplitude and phase (equivalent to having real and imaginary parts). However, the improved normalization does not require complex input images, magnitude images are sufficient. Using the techniques described herein as part of the PSIR reconstruction, which is the focus of this disclosure, does provide complex images, as shown in FIG. 5.

Figure 6:
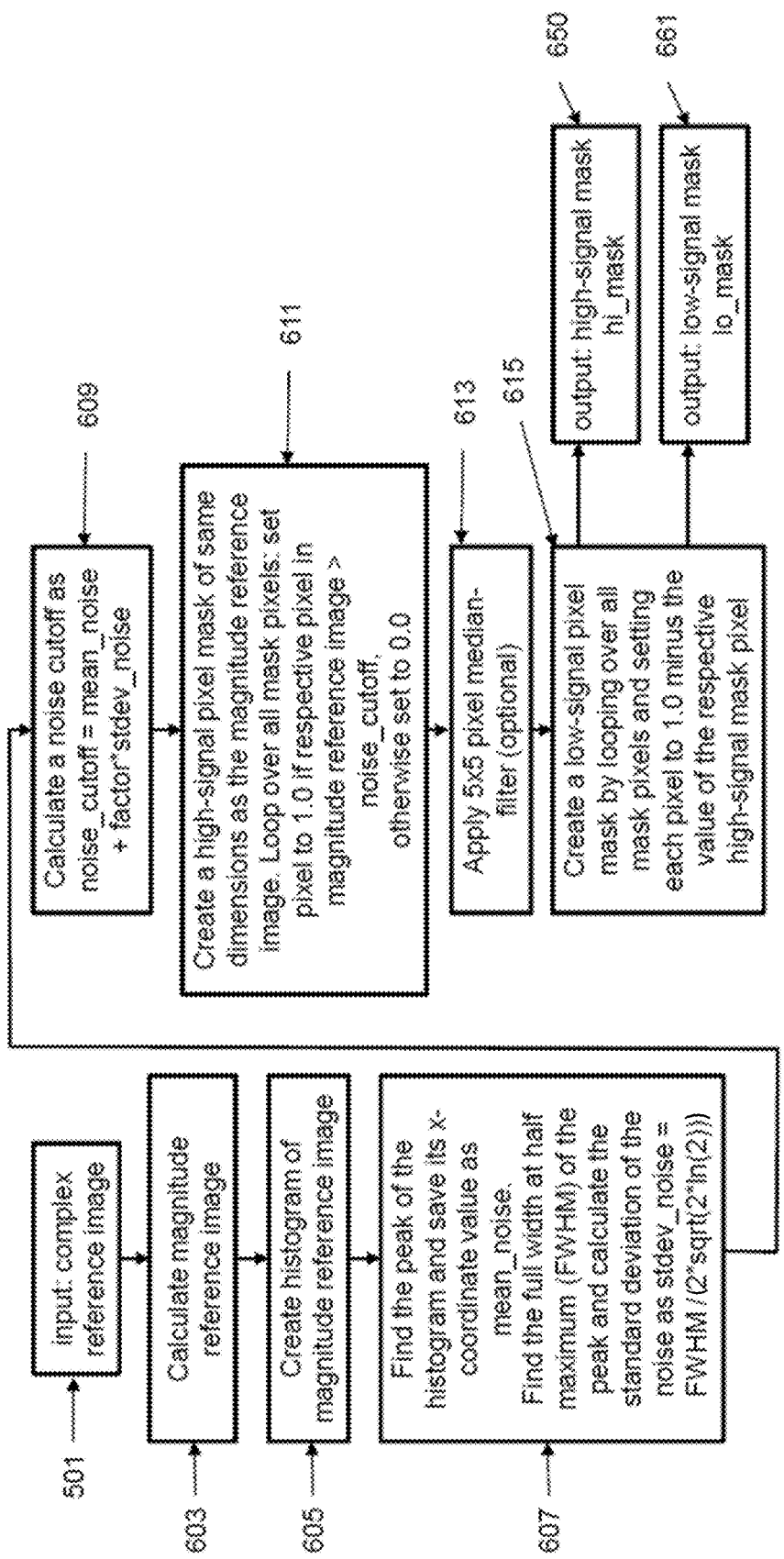
FIG. 6 provides a flowchart detailing the creation of low- and high-signal masks of a reference image of item 510 in FIG. 5, according to some embodiments.

The algorithm has four main steps in this example. First, a low-signal mask is created based on a threshold that is calculated from automatically determined mean and standard deviation of the background noise (510). Each pixel below the threshold is tagged with value 1 in the mask, whereas all other mask pixels are set to 0. A high-signal mask is also created. The high-signal mask is the opposite of the low-signal mask; pixels that are 1 in the low-signal mask are set to 0 in the high-signal mask, and vice versa. Details of mask creation are explained later (FIG. 6). Using these masks and the input reference image, a preliminary coil normalization map is calculated in the second step (520) using an iterative procedure as detailed in FIG. 7. The third step (530) scales the preliminary normalization map between 0.0 and 1.0. Two principal implementations are possible as described in FIGS. 8 and 9. In a fourth step (540) dividing the complex use-image (503) by the normalization map obtained in 530 yields the normalized use image (555). Importantly, the flow chart does not show the entire PSIR reconstruction, but only the coil normalization part. It also does not show any further rescaling of the normalized image to cover a desired dynamic range.

It should be noted that the techniques described in FIG. 5 can also be used for normalizing images acquired by the volume coil built into most MRI scanners. This coil, also known as "body coil," is only used for MR excitation (energy transmit) in most MRI acquisitions, but can also be used for image acquisition (signal receive). It has an intrinsically homogeneous sensitivity profile, which is why it is itself often used as normalization standard or "ground truth" for coil normalization of surface coil images. However, at higher field strengths such as at 3T and beyond, its B1 homogeneity is limited due to the decreased wavelength of the MR signals compared to 1.5T resulting in less homogeneous images acquired by the body coil. Therefore images acquired with the body coil itself need to be normalized and alternatives to coil normalization by the body coil are needed. The technique described in FIG. 5 addresses this need.

FIG. 6 expands on step 510 in FIG. 5. The complex reference image (501) is converted into a magnitude image in step 603 and a histogram is created in step 605. Step 607 finds the peak of the histogram. The pixel intensity at the peak, basically the x-coordinate of the histogram at the location of the peak, represents the mean of the noise "mean_noise," because, in a clinical MR image, the majority of image pixels are typically in air and thus contain only noise. The width of the peak at half its height is then measured as value "FWHM" (full width half maximum), from which the standard deviation of the noise is calculated as "stdev_noise"=FWHM/(2*sqrt(2*ln(2))). The noise cutoff separating high-signal from low-signal regions (air outside the patient and in the lungs for example) is calculated in step 609 as noise_cutoff=mean_noise+factor*stdev_noise. A value of 1.0 for "factor" works well, but both smaller and larger numbers may be used and the techniques described herein shall not be limited to exactly 1.0. A simple thresholding of each pixel is then performed in step 611. For the high-signal mask, all mask pixels that are above noise_cutoff are set to 1, all others to 0. In step 613, the high signal mask is filtered by a median filter of 5×5 pixels. A different filter kernel size may be used depending on the imaged body region and the spatial resolution. The purpose of this step is to eliminate spurious mask pixels, for example, single 1-pixels in background air that are surrounded by 0-pixels and are obviously not part of the high-signal region but wrongly marked due to noise or ghosting artifacts. As the iterative coil normalization map calculation 520 uses smoothing filters anyway, step 613 is optional. Step 615 calculates the low-signal mask by subtracting the high-signal mask from a mask of 1-pixels. Effectively, the mask-pixels of low- and high-signal masks become each other's opposite. A mask pixel that has value 1 in one map has value 0 in the other, and vice versa. Both masks 650 and 661 are provided to the next step.

Figure 7:
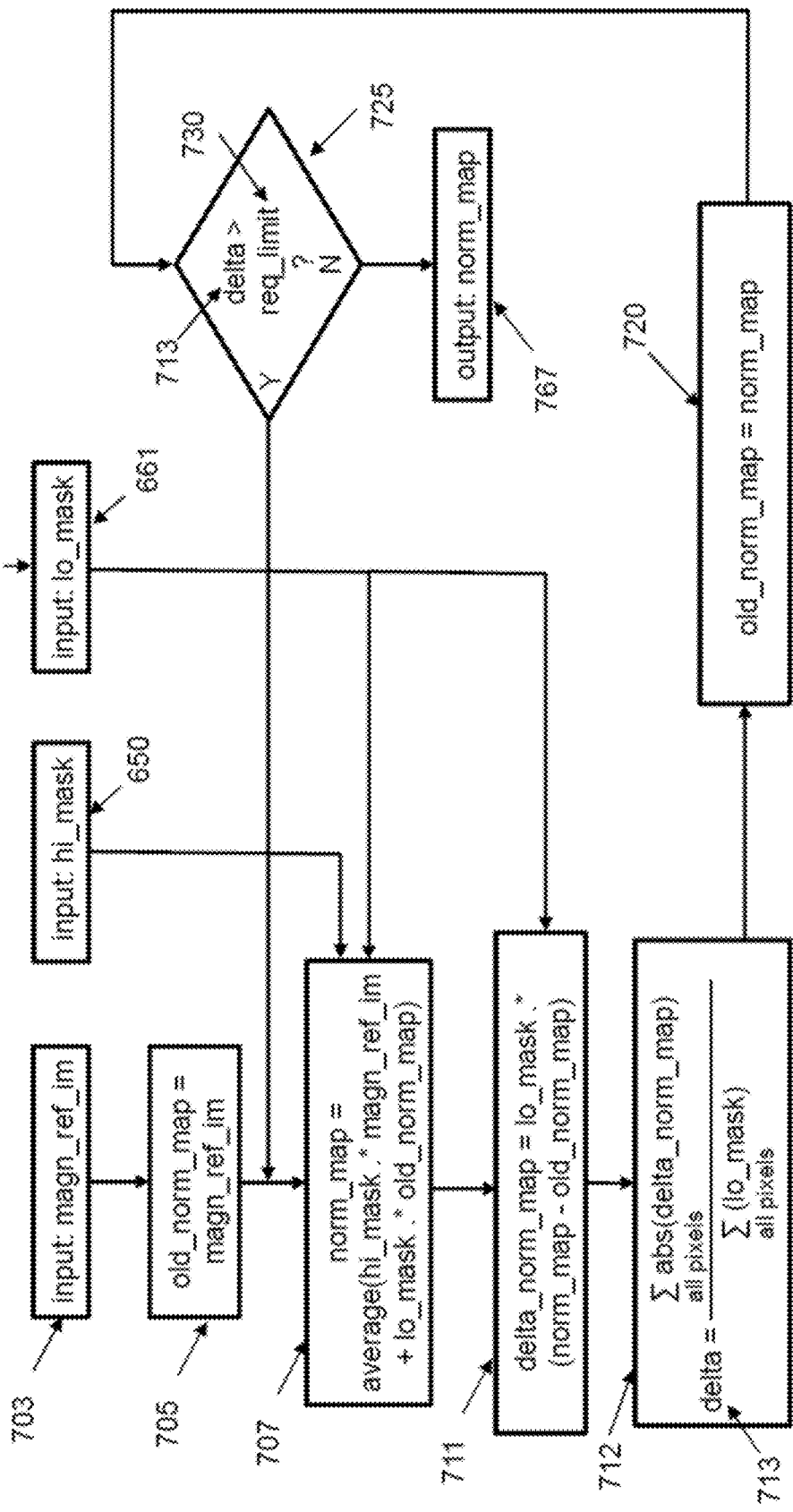
FIG. 7 provides a flow chart showing calculation of a coil normalization map of item 520 in FIG. 5, according to some embodiments.

FIG. 7 shows this next step. Here the iterative coil normalization map calculation procedure (520) takes place. It consists of a loop that is executed until the error "delta" (713 calculated in step 712) is smaller than a predefined limit. Alternatively, the loop can be executed for a fixed number of iterations. During each iteration, the normalization map "norm_map" is improved. The new normalization map "norm_map" is calculated from the old normalization map "old_norm_map" of the previous iteration and the magnitude reference image "magn_ref_im" 703. The Low- and high-signal masks are needed in this step for combining the old normalization map and the magnitude reference image. The calculation is applied in step 707. Before entering the loop, "old_norm_map" is initialized with "magn_ref_im" in step 705. To gauge the changes of the map comparing the maps of the current and the previous iteration, the old map is subtracted from the current map and only the differences in the low-signal area are considered by pixel-wise multiplication (expressed as '.*' operation) with "lo_mask," resulting in 'delta_norm_map' in step 711. The sum of all absolute values of this "delta_norm_map" is calculated and divided by the number of pixels in the low-signal region (calculated as sum of all "lo_mask" pixels) to get an average per-pixel map difference, and is saved as variable "delta" (713) in step 712. The division by the sum of all low-signal pixels is required so that the comparison of delta with a fixed number behaves consistently regardless of the size of the low-signal region and the matrix size of the image. A copy of the current normalization map "norm_map" is saved into "old_norm_map" in step 720, to be used during the next iteration. The conditional step 725 checks if the average per-pixel map difference "delta" (713) is above the required limit "req_limit" (730), which itself is calculated by an algorithm described in FIG. 8. If "delta" is larger than "req_limit," then another iteration of the normalization map calculation is started. If not, the calculation of the normalization map is finished and it is passed on as "norm_map" 767. As stated before, the conditional statement 725 can be replaced by a simple check whether the current iteration has exceeded a required number. For this approach, it is assumed that a sufficient number of iterations will always provide a sufficiently optimized map.

The algorithm of FIG. 7 is one of the core features of the coil normalization technique described here. Whereas conventional techniques only apply single or multiple smoothing steps to the same data, without masking, the disclosed techniques combine the original reference image in the high-signal region with the smoothed map of the previous step in the low-signal region. Thereby the signal of the high-signal region is progressively spilled into the low-signal region so that a normalization map is created even in areas of the reference image that have hardly any signal. In fact, the method described herein supplies energy to the normalization map in every step of the iteration. The advantage is that high-low signal borders in the reference image (for example, air-tissue interfaces) do not create abrupt sensitivity changes in the created normalization map. Therefore artefactual edge enhancement that is often present in images normalized by conventional techniques is absent in images created by the improved normalization map discussed herein. Additionally, the sensitivity in low signal regions is more accurately estimated by the techniques described herein than by simple median or mean filtering, leading to much less salt-and-pepper noise, less amplification of artifacts in low-signal regions, and less bright depiction of the low-signal regions.

Figure 8:
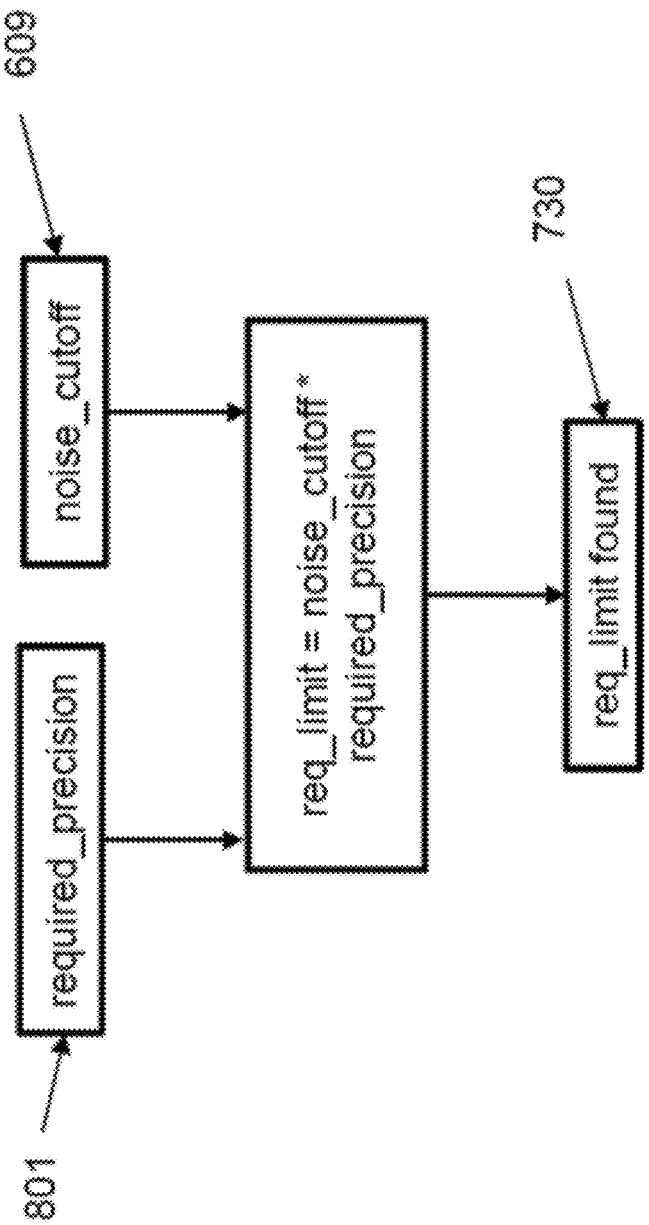
FIG. 8 provides a flow chart detailing step 730 of FIG. 7, the calculation of the upper limit for the sum of the absolute difference pixels used to decide whether to continue or quit the iterative normalization map procedure described herein, according to some embodiments.

FIG. 8 describes the calculation of the required limit "req_limit" 730 needed in step 725 of algorithm 520. It is found by a simple multiplication of the noise cutoff "noise_cutoff" 609 (derived earlier in the disclosure, see FIG. 6) with a scaling factor called "required_precision" 801. A value of 0.15 for "required_precision" 801 works well in practice, but any value in the vicinity will work.

Figure 9:
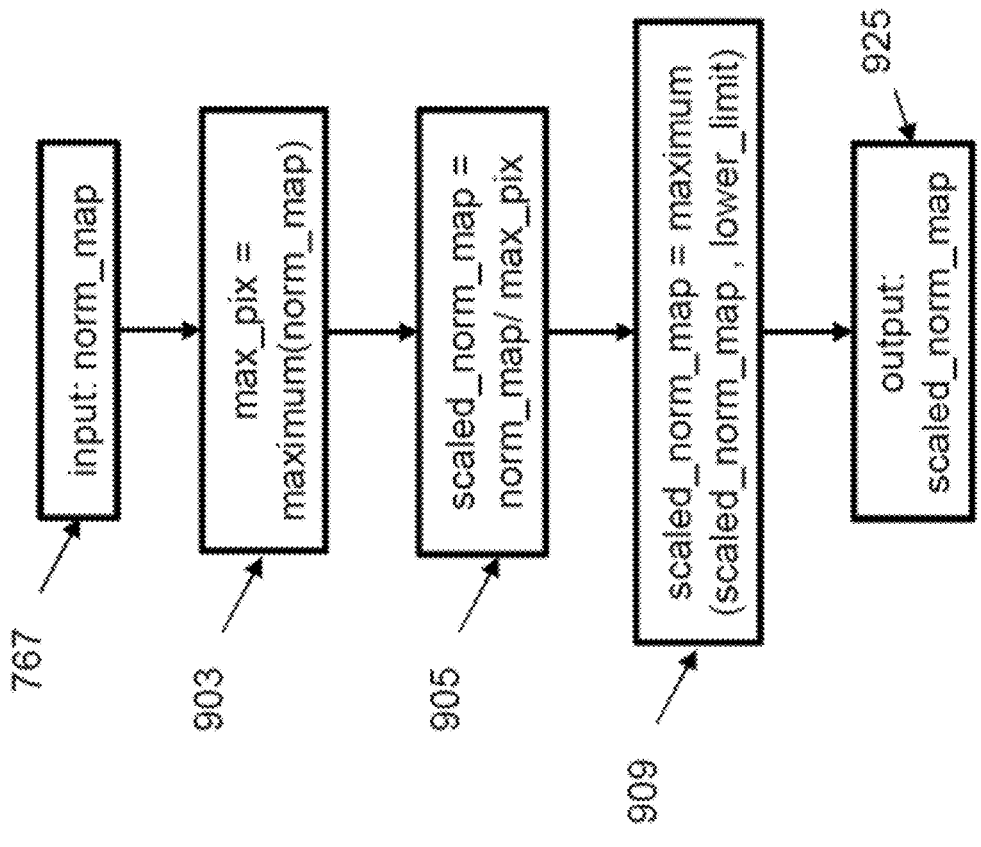
FIG. 9 details a technique for item 530 of FIG. 5 for scaling and trimming the normalization map, according to some embodiments.
Figure 10:
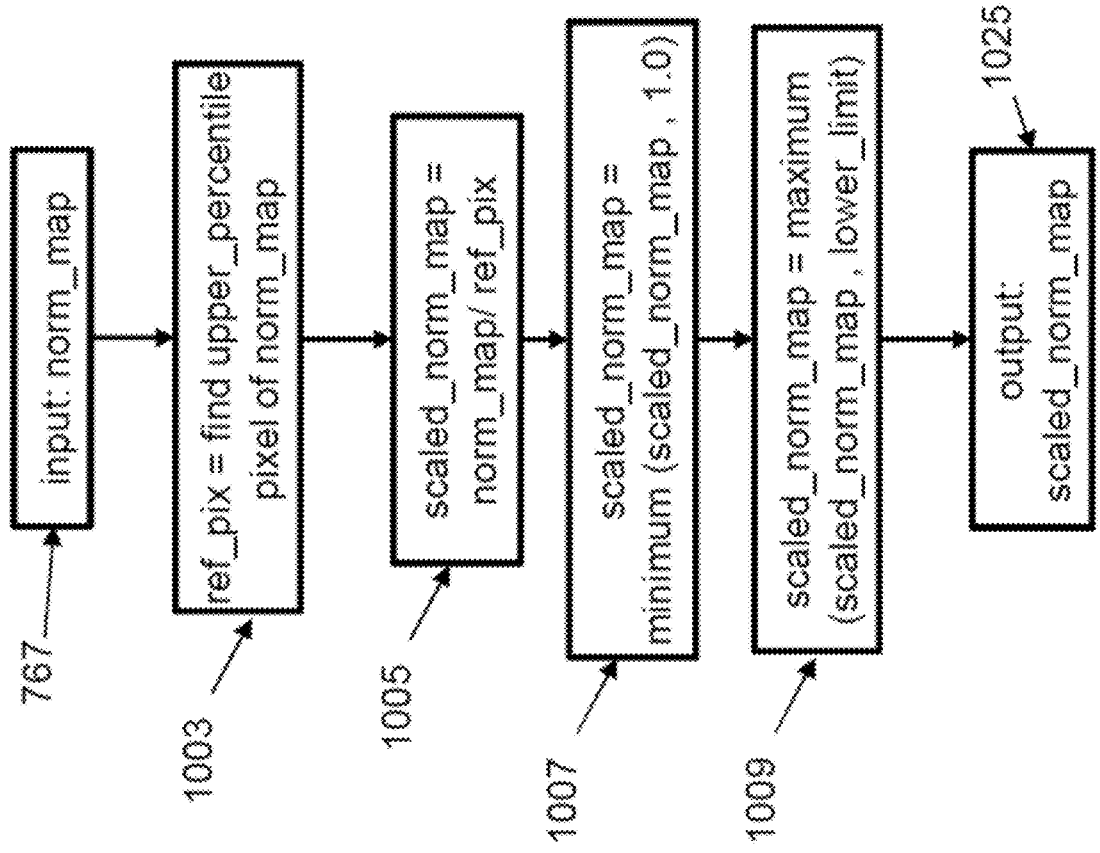
FIG. 10 illustrates an alternative technique for item 530 of FIG. 5 for scaling and trimming the normalization map, according to some embodiments.

FIGS. 9 and 10 show two embodiments of scaling and then trimming the normalization map "norm_map" 767 to values between a minimum and maximum sensitivity. In the example shown in FIG. 9, the maximum pixel value of "norm_map" is found and stored as "max_pix" in step 903. Each pixel of "norm_map" is then divided by "max_pix" creating a scaled normalization map "scaled_norm_map" with pixel values between 0.0 and 1.0, see step 905. In step 909 pixels smaller than a bottom threshold "lower_limit" are set to "lower_limit," for which 0.02 is a good choice. However other values can also be used. When increasing the "lower_limit" salt-and-pepper noise is reduced and the background air becomes darker, which is advantageous, but the normalized use-image in low signal regions may not be completely coil-normalized. In other words, choosing the value for "lower_limit" is a delicate balance between reducing noise artifacts and accurately normalizing the use-image. Note that the "lower_limit" corrects unnaturally low sensitivity values to realistic ones by thresholding.

FIG. 10 depicts an algorithm that is mainly identical to that in FIG. 9 except for steps 1003, 1005, and 1007. In step 1003 we do not search for the brightest pixel intensity (as we do in 903), but we create a histogram of all pixels in "norm_map" and then find the intensity of the pixel at an upper percentile "upper_percentile" of the histogram pixels. 99.9% is an excellent value, but slightly smaller or larger values can be used. Stated differently we sort all pixels in "norm_map" by intensity (the act of creating a histogram) and then find the pixel that is 100% minus "upper_percentile" (e.g., 100%−99.9%=0.1%) away from the brightest pixel in the sorted list of pixels known as histogram. In step 1005 the normalization map is then divided by the value of this reference pixel "ref_pix" from step 1003. In the scaled map "scaled_norm_map" 100% minus "upper_percentile" (for example, 0.1%) of the pixels have values larger than 1.0. These pixels are clipped at 1.0 in step 1007. The reason for taking a percentile rather than the maximum intensity pixel (as in FIG. 9) is that the latter is often artificially high due to noise or artifacts and does not represent true maximum sensitivity. By using the upper percentile value instead, which is a statistical measure, this problem is circumvented and map scaling becomes consistent regardless of noise and artifact levels in a given reference image. As in step 909, step 1009 raises the "scaled_norm_map" values to a minimum value of "lower_limit" with the advantages already described. The processed normalization map "scaled_norm_map" from either 925 or 1025 can be used in step 540 for performing the actual coil normalization.

Figure 3:
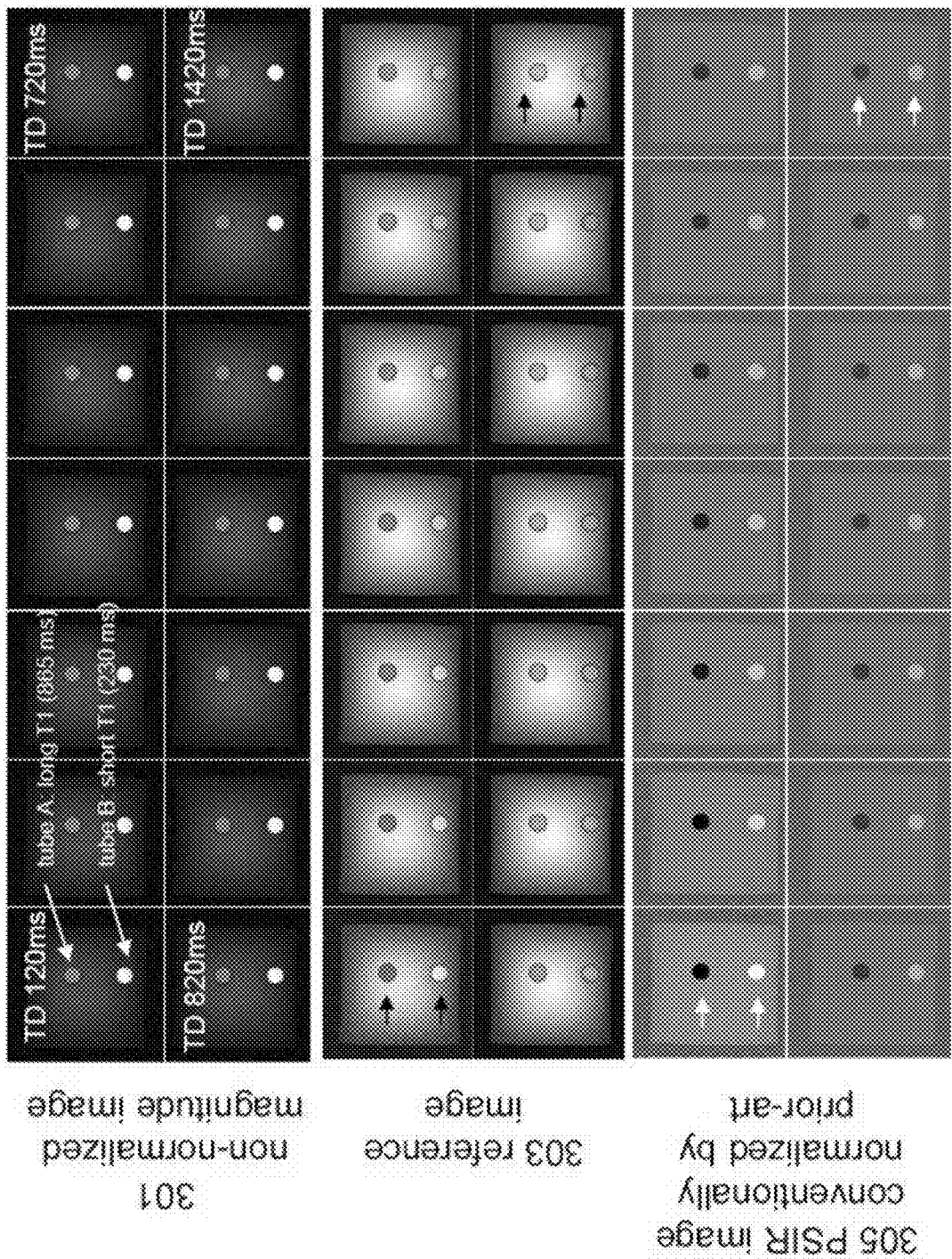
FIG. 3 is an illustration of the corruption of T1-contrast in the PSIR image obtained by the conventional coil normalization of PSIR.
Figure 11:
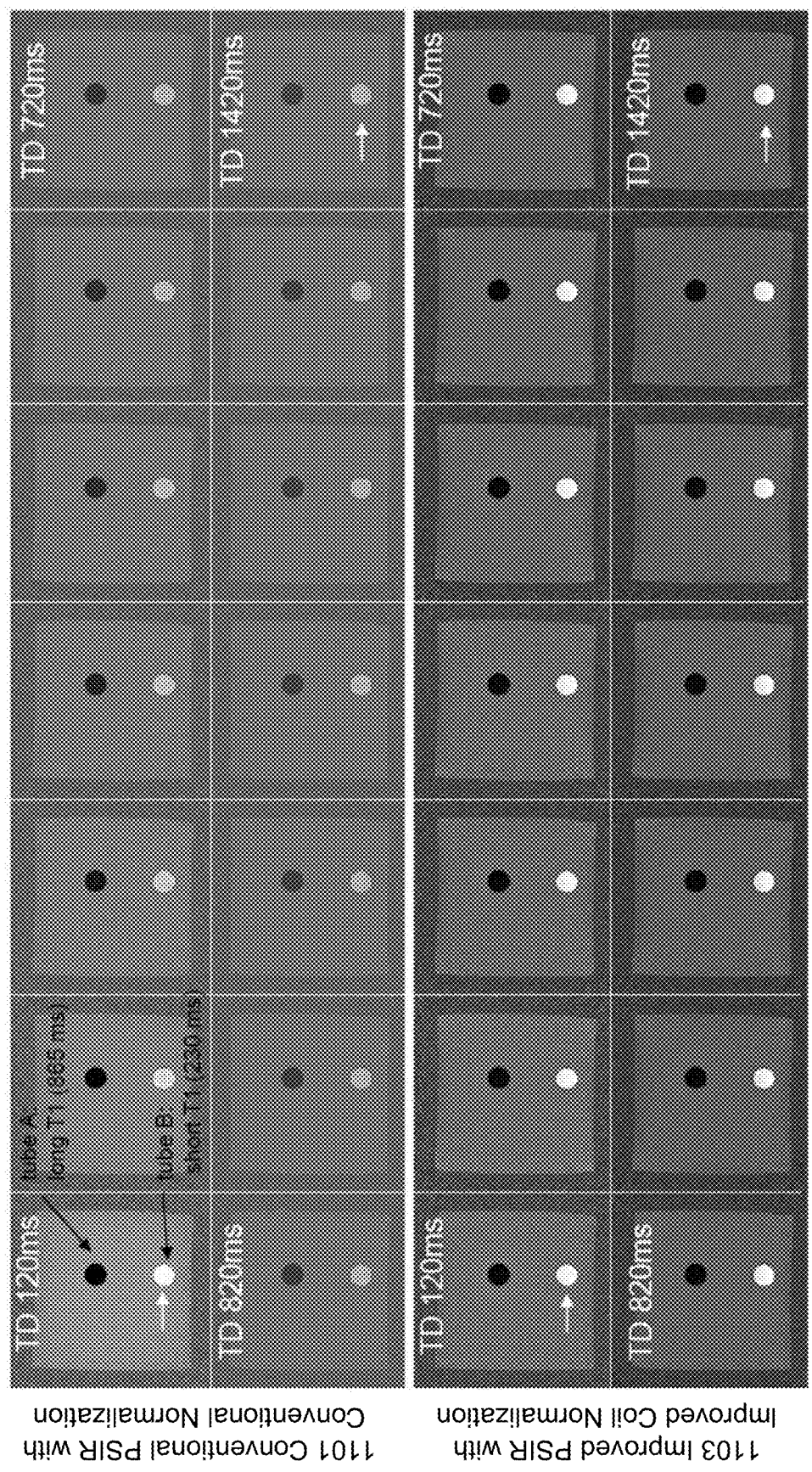
FIG. 11 shows the result of the conventional coil normalization as part of the PSIR reconstruction and of the improved coil normalization discussed here integrated into the PSIR reconstruction applied to a T1-phantom, according to some embodiments.

FIG. 11, upper panel, shows the result of the conventional coil normalization as part of the PSIR reconstruction (1101) and of the improved coil normalization discussed here integrated into the PSIR reconstruction, lower panel (1103). These images are obtained from the same experiment as shown in FIG. 3 wherein reference images with changing T1-contrast were supplied to the conventional coil normalization algorithm and the algorithms disclosed herein for testing their robustness towards T1-weighting of the reference image. FIG. 11 shows that the conventional coil normalization has a strong dependence on the T1-weighting of the reference. In the conventional PSIR, the intensity difference between the long-T1 tube (A) and the short-T1 tube (B) in the coil-normalized PSIR images varies significantly between PSIR images using different reference T1-weighting. This becomes obvious when comparing the intensity of test tube B at TD 120 ms with TD 1420 ms, see horizontal white arrows. The improved coil normalization described herein, on the other hand, creates a consistent contrast between both test tubes regardless of the reference image T1-weighting, see again horizontal white arrows. This means that an image normalized by the techniques described herein will show the same image contrast in a patient independent of heart rate, trigger pulse, flip angle, or other factors affecting the T1-weighting in a pulse sequence.

Figure 4:
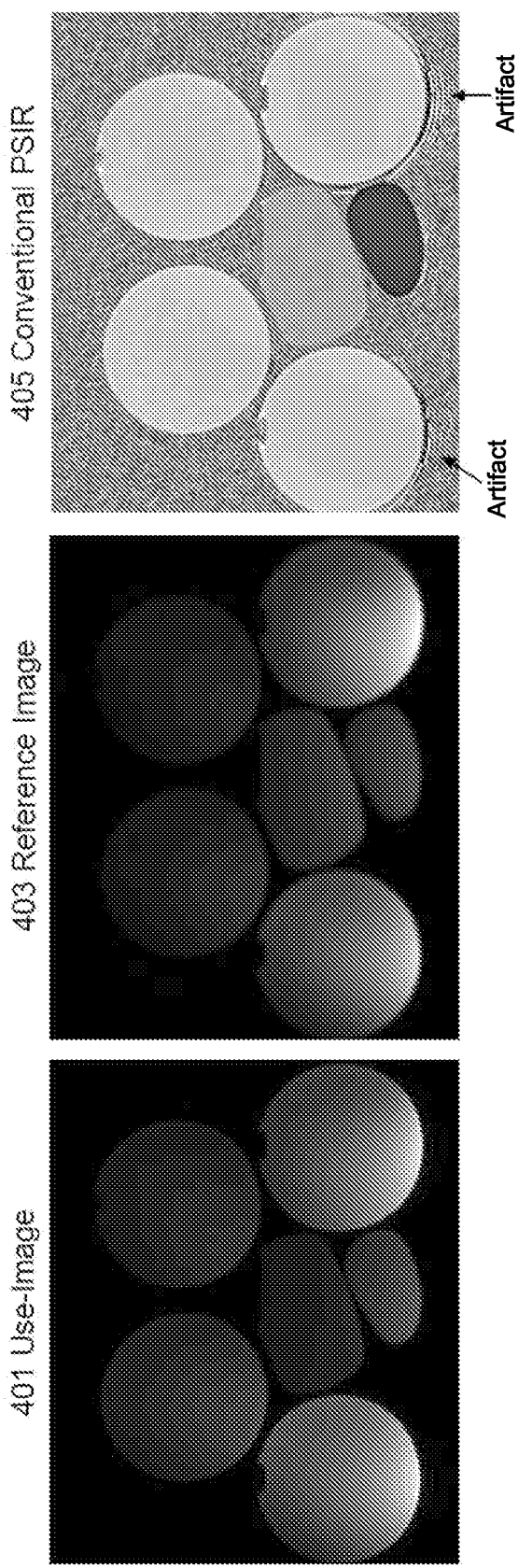
FIG. 4 provides images of a phantom illustrating artifacts resulting from conventional PSIR acquisitions.
Figure 12:
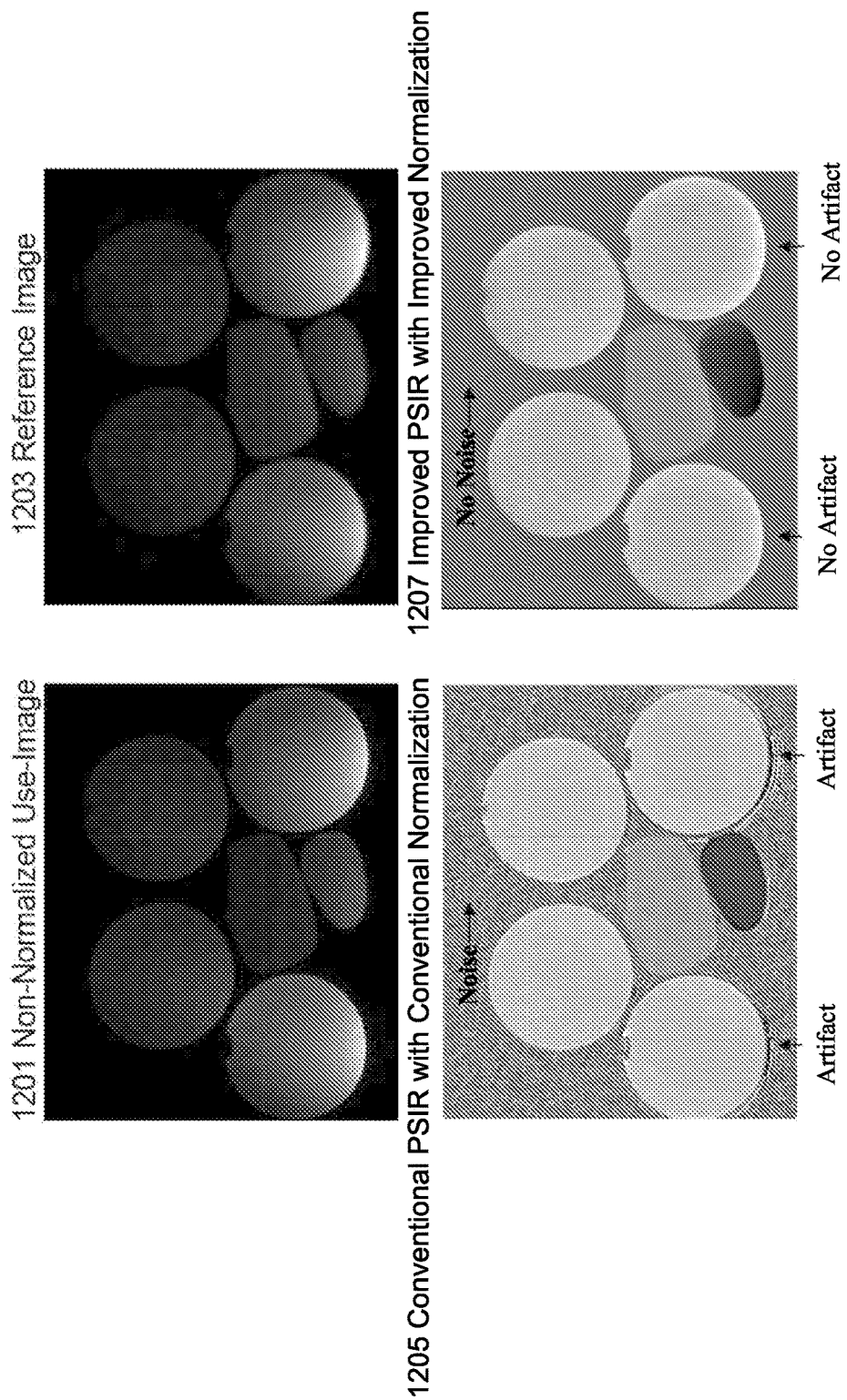
FIG. 12 shows another comparison of PSIR T1-phantom images reconstructed with conventional coil normalization and normalization according to the techniques described herein.

FIG. 12 shows another comparison of PSIR images reconstructed with conventional coil normalization and normalization according to the techniques described herein. The first three images are the non-normalized use-image (1201), which is a magnitude image, the reference image (1203, non-normalized), and the conventional normalized PSIR image (1205). They are identical to those in FIG. 4. They are shown for comparison to the improved PSIR image (1207) normalized with the disclosed coil normalization. Both PSIR images were reconstructed from the same data. Two image quality improvements are visible. First, the Gibbs ringing artifact apparent in the conventional PSIR image (1205, arrows facing upwards) is not present in the improved PSIR image (1207) using the disclosed coil normalization. Second, the background air has significant salt-and-pepper noise in the conventional PSIR image (1205, horizontal arrow pointing to the right), which is largely absent in the image using the improved techniques described herein (1207).

Figure 13:
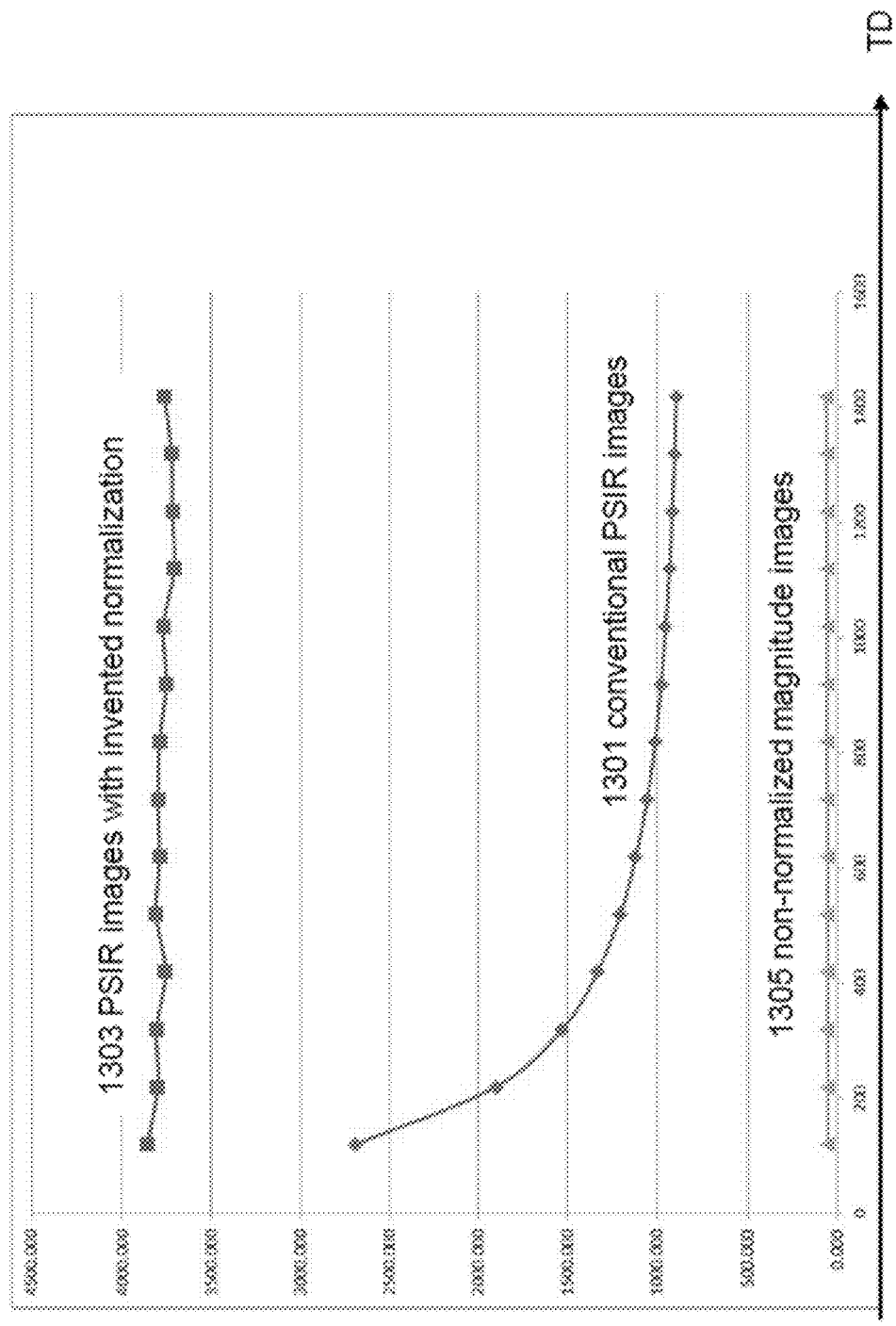
FIG. 13 provides a qualitative comparison of the PSIR images, specifically the signal difference of tube B and A, of FIG. 11 reconstructed with conventional (item 1101) and coil normalization as disclosed here (item 1103) and non-normalized magnitude images of FIG. 3 (item 301)

FIG. 13 represents a qualitative evaluation of the PSIR images of FIG. 11 and non-normalized magnitude images of FIG. 3. The mean signal in both test tubes was measured in all images. From these measurements the signal difference between the test tubes was calculated as signal of short-T1 tube B minus long-T1 tube A, and plotted as function of time delay TD. Recall that TD was varied as means of imparting different T1-weighting on the reference image. It can be appreciated that the non-normalized magnitude images show a test tube difference (1305) independent from TD as indicated by the flat curve; no reference image was used for reconstructing these images. The difference obtained with conventional PSIR using the conventional coil normalization (1301) shows a strong dependence on TD, confirming that reference image T1-weighting has a significant effect on image contrast in the conventional PSIR images. However, the PSIR images using the disclosed coil normalization (1303) produce an image contrast that is independent of the reference image T1-weighting. This contrast is as consistent as the contrast in the non-normalized magnitude images. Note that the horizontal evolution (basically a zero slope) present in 1303 and 1305 indicates independence from T1-weighting, regardless of the absolute value of each curve.

Figure 14:
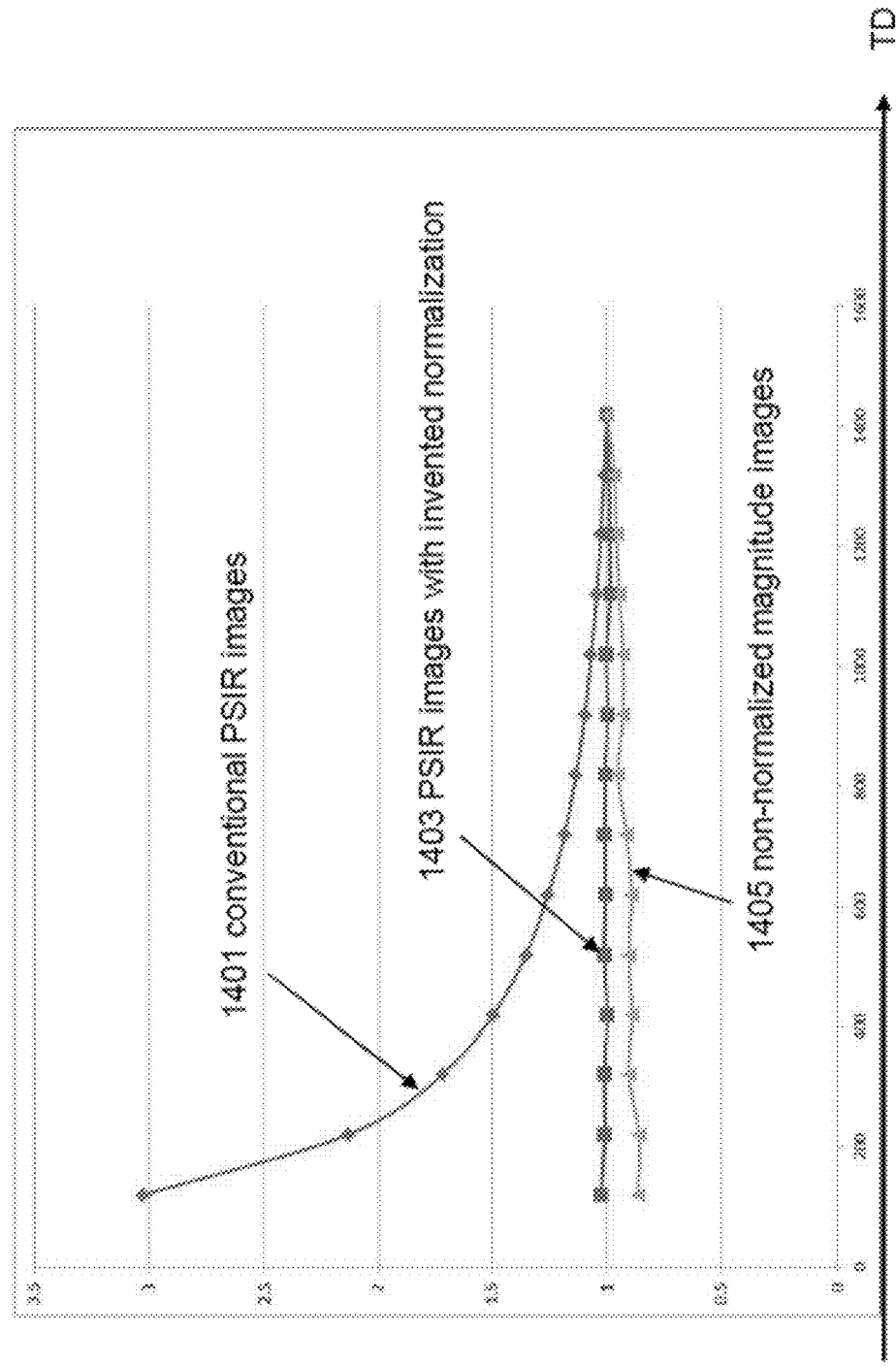
FIG. 14 provides a similar qualitative comparison to FIG. 13, with the difference that each signal difference curve is normalized to its right most value for the purpose of a better comparison of curve shape and difference.

FIG. 14 allows for better comparison of the three curves. Each curve of FIG. 13 was normalized to its value at TD=1420 ms. For reference images with little T1-weighting (TD>1000 ms) all three images have similar favorable contrast properties. When increasing reference T1-weighting by reducing TD (TD<1000 ms), the contrast in the conventional PSIR images with conventional normalization (1401) changes significantly, whereas it remains mainly constant in the non-normalized magnitude images (1405) and the PSIR images normalized with the techniques described herein (1403).

Figure 15:
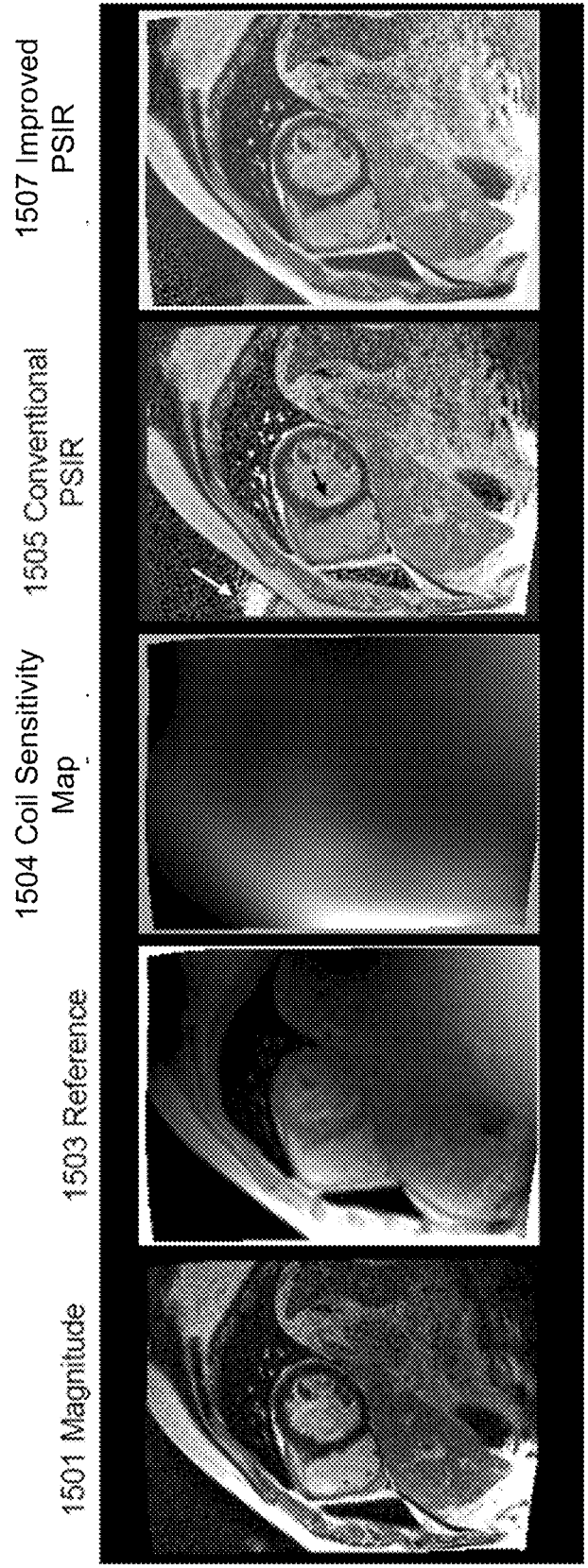
FIG. 15 shows images acquired in a cardiac patient demonstrating the improved PSIR process due to the invented coil normalization, according to some embodiments of the present invention.

FIG. 15 shows images acquired in a cardiac patient, according to some embodiments of the present invention. All images and maps were reconstructed from the same data. The magnitude image (1501) was coil-normalized with a conventional algorithm. The reference image (1503) contains coil sensitivity as well as morphologic information, the latter being at least partially owed to T1-weighting. The techniques described herein created the coil sensitivity map shown in 1504. The PSIR image obtained with conventional coil normalization (1505) shows the typical salt-and-pepper noise in lungs and air. The pulmonary vessels appear larger than in the magnitude image (1501). Furthermore, the anterior fold-in artifact that is hardly visible in the magnitude image is significantly amplified, see white arrow (1505), and the bright region on the LV side of the septum (black arrow) is increased compared to the magnitude image. The PSIR image normalized with the disclosed techniques (1507) has hardly any salt-and-pepper noise and the fold-in artifact is barely noticeable. Pulmonary vessels are depicted in the same size as in the magnitude image.

Figure 16:
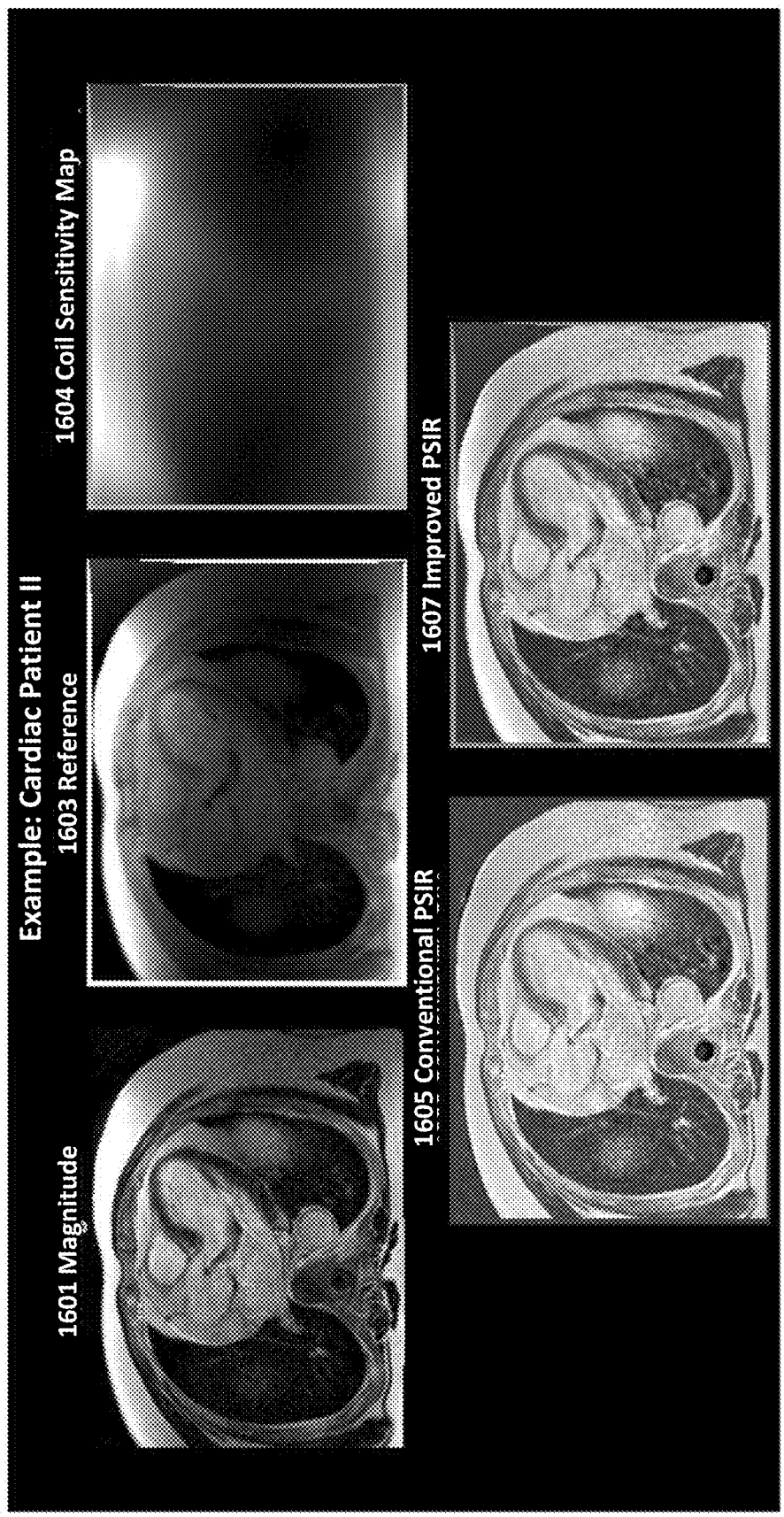
FIG. 16 shows images acquired in a second cardiac patient demonstrating the improved PSIR process due to the disclosed coil normalization, according to some embodiments of the present invention.

FIG. 16 shows another patient example. The far left corner of the figure shows a magnitude image (1601) of the patent's anatomy. Interestingly, the reference image (1603) again shows significant tissue contrast that can potentially reduce the contrast of the conventionally normalized PSIR image (1605). The techniques disclosed herein produced the coil sensitivity map of panel 1604 which was used it to create the coil-normalized PSIR image in 1607.

Various additions, enhancements, and other modifications may be made to the coil normalization technique described herein. For example, in some embodiments, the mean and the standard deviation of the noise needed for calculating the "noise_cutoff" could be found by thresholding the reference image into a noise-mask which tags pixels below a certain threshold; this threshold would be derived from the reference image minimum and maximum pixel values. Then the mean value of the pixels tagged by the noise-mask could be calculated and taken as mean noise value. The assessment of mean noise by finding the maximum of the histogram would then be unnecessary. The "noise_cutoff" could be derived from the mean noise and a scaling factor, which could be calculated from the minimum and maximum pixel values of the reference image. Another variation of the improved coil normalization technique described herein would be to replace the "lo_mask" and "hi_mask" created in algorithm 510, which are binary masks, with multi-level masks. This approach may further ease the normalization map transition between regions of high and low signal in the reference image.

Figure 17:
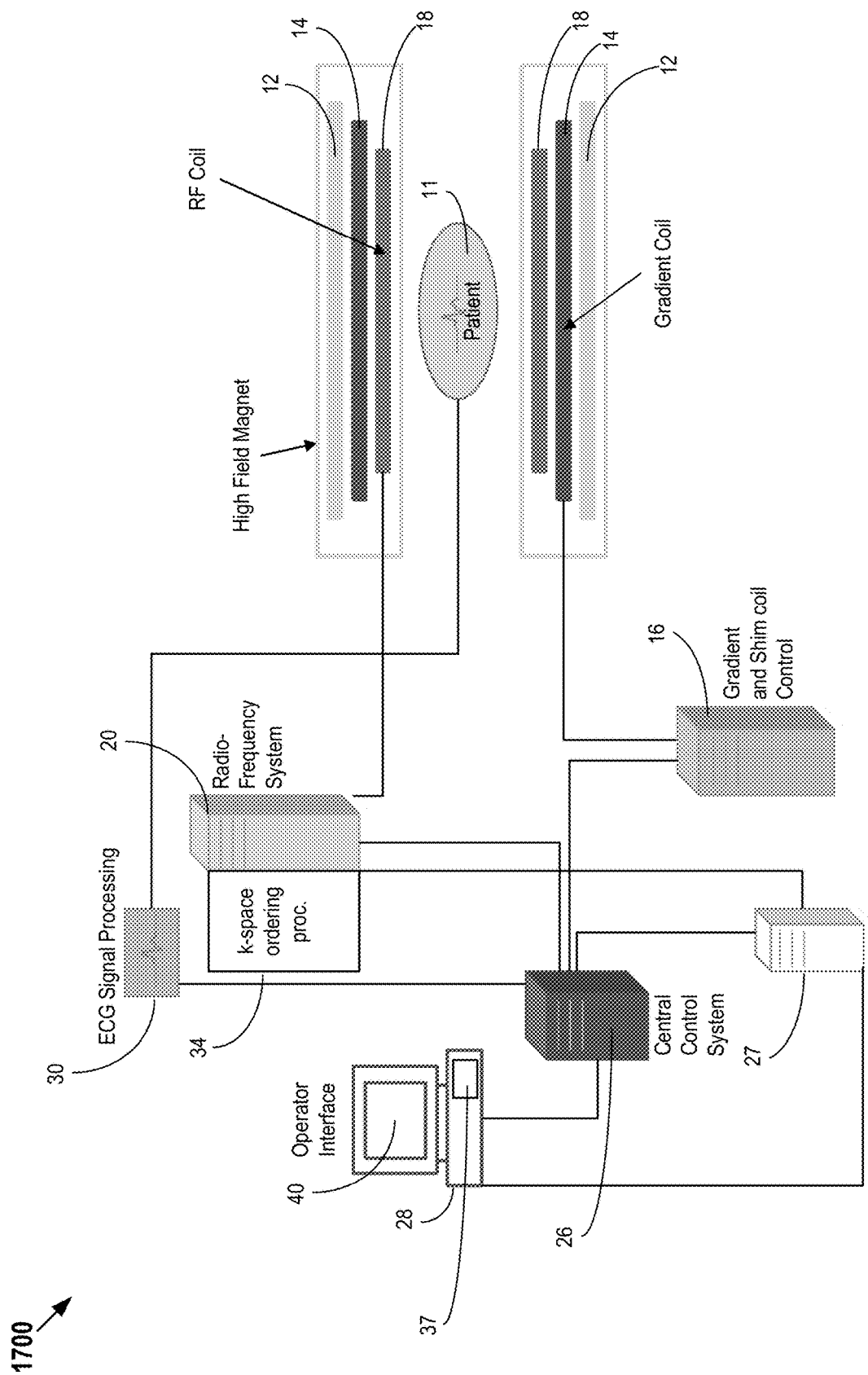
FIG. 17 shows system for ordering acquisition of frequency domain components representing MR image data for storage in a k-space storage array, as may be used in some embodiments of the present invention.

FIG. 17 shows system 1700 for ordering acquisition of frequency domain components representing MR image data for storage in a k-space storage array, as may be used in some embodiments of the present invention. In system 1700, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, Radio Frequency (RF) module 20 provides RF pulse signals to RF coil 18, which in response produces magnetic field pulses which rotate the spins of the protons in the patient 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and Magnetic Resonance signal detection, to acquire Magnetic Resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor. In some embodiments, the image data processor is located in central control unit 26, while in other embodiments such as the one depicted in FIG. 17, the image data processor is located in a separate unit 27. Electrocardiogram (ECG) synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements which each have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and the magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 1700. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central control unit 26 and enables user modification of Magnetic Resonance imaging signals in substantially real time. Display processor 37 processes the Magnetic Resonance signals to provide image representative data for display on display 40, for example.

A processor as used herein is a computer, processing device, logic array or other device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A display processor or generator is a known element comprising electronic circuitry or software or a combination of both for generating display images or portions thereof.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A user interface (UI), as used herein, comprises one or more display images, generated by a display processor and enabling user interaction with a processor or other device and associated data acquisition and processing functions. The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The embodiments of the present disclosure may be implemented with any combination of hardware and software components. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately. Further, the processes and applications may, in alternative embodiments, be located on one or more (e.g., distributed) processing devices on a network linking the units of FIG. 17.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. No claim element herein is to be construed under the provisions of 35 U.S.C. § 112(f), unless the element is expressly recited using the phrase "means for."

We claim:

1. A computer-implemented method for correcting image inhomogeneity caused by inhomogeneous sensitivity of receiver coils using during a Magnetic Resonance Imaging (MRI) acquisition, the method comprising:
   acquiring a non-normalized image using one or more receiver coils;
   acquiring a reference image with the receiver coils;
   creating a high-signal mask of the reference image, wherein each pixel in the high-signal mask at its specific location is set to a predetermined integer value if the reference image pixel at the same specific location has a value above a threshold value;
   creating a low-signal mask of the reference image, wherein each pixel in the low-signal mask at its specific location is set to the predetermined integer value if the reference image pixel at the same specific location has a value below or equal to the threshold value;
   creating a current coil normalization map by smoothing the reference image with one or more filters;
   performing an iterative procedure until occurrence of a stopping condition, the iterative procedure comprising:
   creating a new coil normalization map comprising (i) portions of the current coil normalization map corresponding to pixels marked with the predetermined integer value in the low-signal mask, and (ii) portions of the reference image corresponding to pixels marked with the predetermined integer value in the high-signal mask,
   smoothing the new coil normalization map using the filters, and
   replacing the current coil normalization map with the new coil normalization map; and
   following the iterative procedure, dividing the non-normalized image by the current coil normalization map to yield a normalized image.

2. The method of claim 1, wherein the stopping condition is a maximum number of iterations.

3. The method of claim 1, wherein the stopping condition is that a sum of absolute values of a pixel difference map between an old and a new coil normalization map is below a predefined limit.

4. The method of claim 1, wherein the threshold equals mean of noise in the reference image plus standard deviation of the noise in the reference image.

5. The method of claim 4, wherein the mean and the standard deviation are derived from a histogram of the reference image.

6. The method of claim 1, wherein the filters comprise a mean-filter smoothing in image space.

7. The method of claim 6, wherein the mean-filter is at least 20 mm large in any given dimension.

8. The method of claim 1, wherein the filters comprise a median-filter smoothing in image space.

9. The method of claim 1, wherein the filters comprise a low pass filter smoothing in raw data space.

10. The method of claim 1, wherein the non-normalized image is a real part image obtained from a phase-sensitive reconstruction.

11. An article of manufacture for correcting image inhomogeneity caused by inhomogeneous sensitivity of receiver coils using during an Magnetic Resonance Imaging (MRI) acquisition, the article of manufacture comprising a non-transitory, tangible computer-readable medium holding computer-executable instructions for performing a method comprising:

receiving a non-normalized image using one or more receiver coils;

receiving a reference image with the receiver coils;

creating a high-signal mask of the reference image, wherein each pixel in the high-signal mask at its specific location is set to a predetermined integer value if the reference image pixel at the same specific location has a value above a threshold value;

creating a low-signal mask of the reference image, wherein each pixel in the low-signal mask at its specific location is set to the predetermined integer value if the reference image pixel at the same specific location has a value below or equal to the threshold value;

creating a current coil normalization map by smoothing the reference image with one or more filters;

performing an iterative procedure until occurrence of a stopping condition, the iterative procedure comprising:

creating a new coil normalization map comprising (i) portions of the current coil normalization map corresponding to pixels included in the low-signal mask, and (ii) portions of the reference image corresponding to pixels included in the high-signal mask, smoothing the new coil normalization map using the filters, and replacing the current coil normalization map with the new coil normalization map; and following the iterative procedure, dividing the non-normalized image by the current coil normalization map to yield a normalized image.

12. The article of manufacture of claim 11, wherein the stopping condition is a maximum number of iterations.

13. The article of manufacture of claim 11, wherein the stopping condition is that a sum of absolute values of a pixel difference map between an old and a new coil normalization map is below a predefined limit.

14. The article of manufacture of claim 11, wherein the threshold equals mean of noise in the reference image plus standard deviation of the noise in the reference image.

15. The article of manufacture of claim 14, wherein the mean and the standard deviation are derived from a histogram of the reference image.

16. The article of manufacture of claim 11, wherein the filters comprise a mean-filter smoothing in image space.

17. The article of manufacture of claim 16, wherein the mean-filter is at least 20 mm large in any given dimension.

18. The article of manufacture of claim 11, wherein the filters comprise a median-filter smoothing in image space.

19. The article of manufacture of claim 11, wherein the filters comprise a low pass filter smoothing in raw data space.

20. A system for correcting image inhomogeneity caused by inhomogeneous sensitivity of receiver coils using during a Magnetic Resonance Imaging (MRI) acquisition, the system comprising:

a magnetic field generator comprising one or more coils configured to acquire a non-normalized image and a reference image;

one or more computers connected to the magnetic field generator and configured to:

acquire a reference image with the receiver coils;

create a high-signal mask of the reference image, wherein each pixel in the high-signal mask at its specific location is set to a predetermined integer value if the reference image pixel at the same specific location has a value above a threshold value;

create a low-signal mask of the reference image, wherein each pixel in the low-signal mask at its specific location is set to the predetermined integer value if the reference image pixel at the same specific location has a value below or equal to the threshold value;

create a current coil normalization map by smoothing the reference image with one or more filters;

perform an iterative procedure until occurrence of a stopping condition, the iterative procedure comprising:

create a new coil normalization map comprising (i) portions of the current coil normalization map corresponding to pixels included in the low-signal mask, and (ii) portions of the reference image corresponding to pixels included in the high-signal mask, smooth the new coil normalization map using the filters, and replace the current coil normalization map with the new coil normalization map; and following the iterative procedure, divide the non-normalized image by the current coil normalization map to yield a normalized image.

* * * * *